(12) United States Patent
Sogard

(10) Patent No.: US 9,423,704 B2
(45) Date of Patent: Aug. 23, 2016

(54) APPARATUS AND METHODS FOR MEASURING THERMALLY INDUCED RETICLE DISTORTION

(71) Applicant: Nikon Corporation, Tokyo (JP)

(72) Inventor: Michael Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 14/634,290

(22) Filed: Feb. 27, 2015

(65) Prior Publication Data

US 2015/0309418 A1 Oct. 29, 2015

Related U.S. Application Data

(62) Division of application No. 13/277,085, filed on Oct. 19, 2011, now Pat. No. 8,994,918.

(60) Provisional application No. 61/405,592, filed on Oct. 21, 2010, provisional application No. 61/443,630, filed on Feb. 16, 2011.

(51) Int. Cl.
*G03B 27/68* (2006.01)
*G03F 7/20* (2006.01)
*G03F 1/84* (2012.01)

(52) U.S. Cl.
CPC ............... *G03F 7/7085* (2013.01); *G03F 1/84* (2013.01); *G03F 7/70783* (2013.01); *G03F 7/70875* (2013.01)

(58) Field of Classification Search
CPC .......................... G03F 7/7085; G03F 7/70875
USPC .................... 355/52, 53, 55, 67, 77
See application file for complete search history.

(56) References Cited

U.S. PATENT DOCUMENTS

| | | | |
|---|---|---|---|
| 4,623,256 A | 11/1986 | Ikenaga et al. | |
| 5,663,569 A | 9/1997 | Hayano | |
| 5,870,189 A | 2/1999 | Uesugi et al. | |
| 6,064,477 A | 5/2000 | Matsumoto et al. | |
| 6,084,664 A * | 7/2000 | Matsumoto | G01N 21/94 250/559.41 |
| 6,600,565 B1 | 7/2003 | Suresh et al. | |

(Continued)

FOREIGN PATENT DOCUMENTS

JP 2001028328 1/2001

OTHER PUBLICATIONS

Dändliker et al., "Measuring microvibrations by heterodyne speckle interferometry," Opt. Lett. 6:165-167, (1981).

*Primary Examiner* — Hung Henry Nguyen
(74) *Attorney, Agent, or Firm* — Klarquist Sparkman, LLP

(57) ABSTRACT

An apparatus and method for measuring thermo-mechanically induced reticle distortion or other distortion in a lithography device enables detecting distortion at the nanometer level in situ. The techniques described use relatively simple optical detectors and data acquisition electronics that are capable of monitoring the distortion in real time, during operation of the lithography equipment. Time-varying anisotropic distortion of a reticle can be measured by directing slit patterns of light having different orientations to the reticle and detecting reflected, transmitted or diffracted light from the reticle. In one example, corresponding segments of successive time measurements of secondary light signals are compared as the reticle scans a substrate at a reticle stage speed of about 1 m/s to detect temporal offsets and other features that correspond to spatial distortion.

22 Claims, 13 Drawing Sheets

(56) References Cited

U.S. PATENT DOCUMENTS

| | | |
|---|---|---|
| 7,251,033 B1 | 7/2007 | Phan et al. |
| 8,634,054 B2 | 1/2014 | Vladimirsky et al. |
| 2006/0273267 A1* | 12/2006 | Maeda ............ G03F 7/70725 250/548 |

* cited by examiner

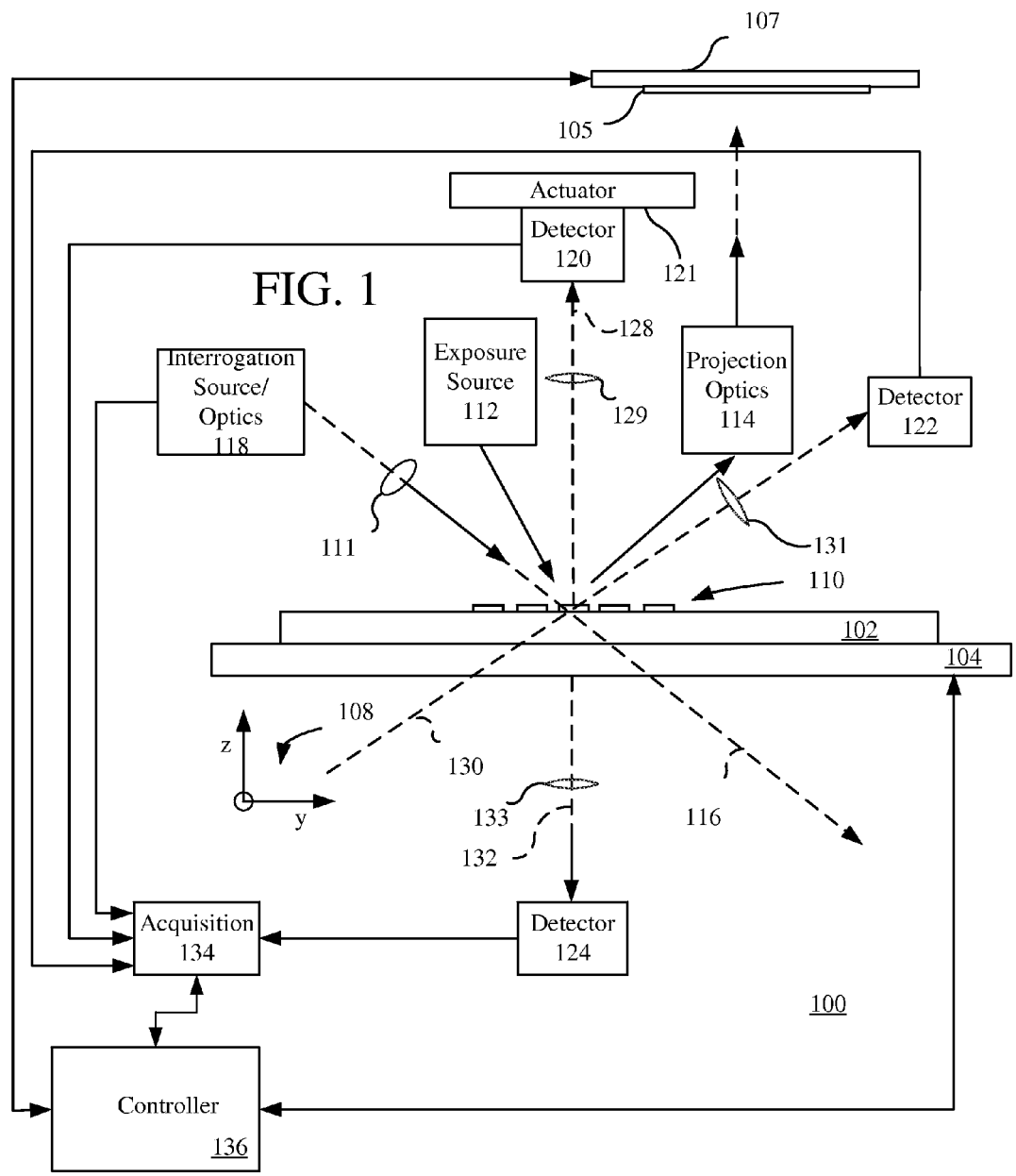

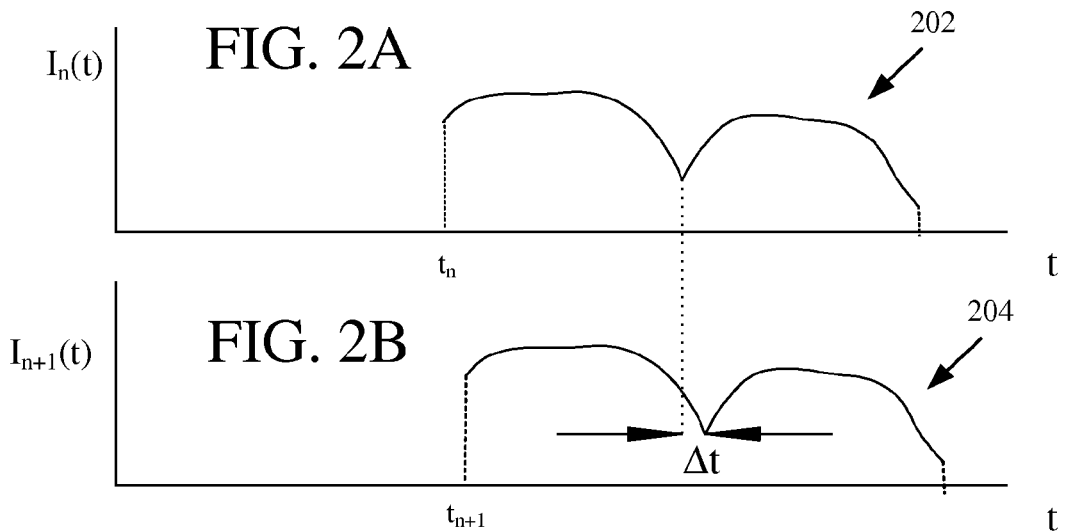
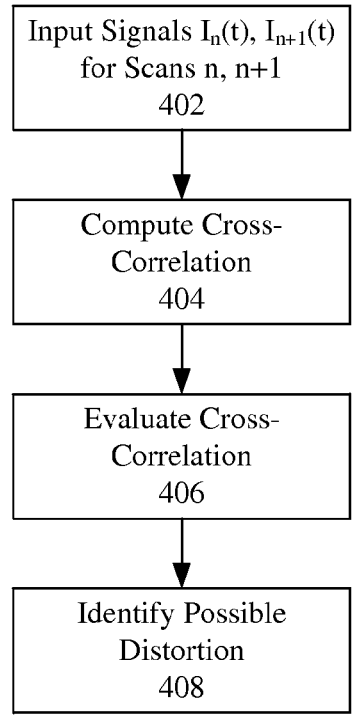

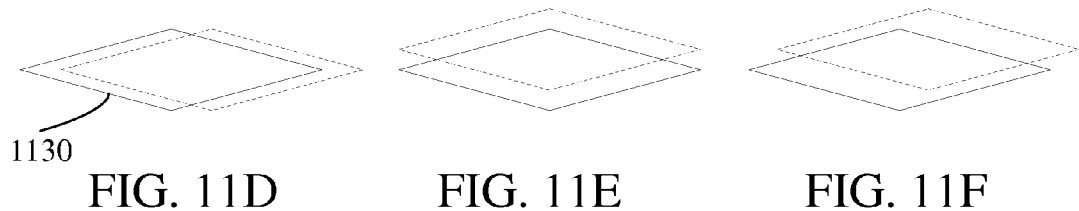
1130    FIG. 11D         FIG. 11E         FIG. 11F
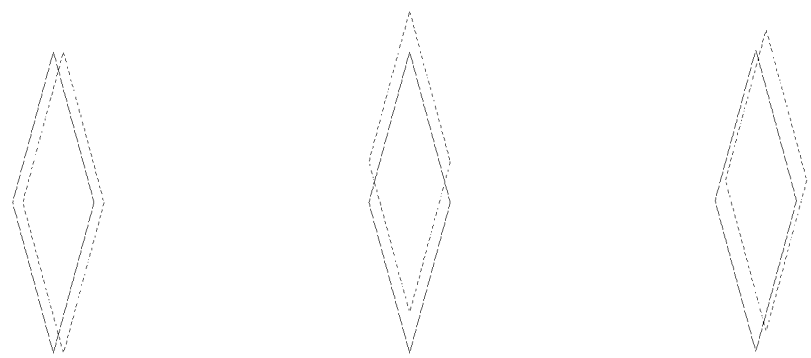
FIG. 11G         FIG. 11H         FIG. 11I

APPARATUS AND METHODS FOR MEASURING THERMALLY INDUCED RETICLE DISTORTION

This application is a divisional of U.S. patent application Ser. No. 13/277,085, filed Oct. 19, 2011, issued as U.S. Pat. No. 8,994,918, which claims the benefit of U.S. Provisional Patent Application No. 61/405,592, filed Oct. 21, 2010, and U.S. Provisional Patent Application No. 61/443,630, filed Feb. 16, 2011, all of which are incorporated herein by reference in their entireties.

FIELD

This disclosure pertains to, inter alia, reticles used for optical patterning of nanometer-sized features. More specifically, the disclosure pertains to techniques for measuring dimensional changes and distortion of a reticle primarily caused by reticle heating due to incident illumination.

BACKGROUND

Optical lithography may be used to pattern features on a substrate by illuminating a light-sensitive layer of the substrate at a wavelength comparable to a desired feature size. Such a technique is commonly used in the semiconductor industry, for example, to pattern integrated circuits on semiconductor wafers. State-of-the-art semiconductor lithography utilizes light of ultraviolet (UV) or deep ultraviolet (DUV) wavelengths, typically in the range of 150-500 nm, to pattern successive layers of material, in order to form electronic structures having feature sizes in the submicron-to-nanometer range.

The process of transferring a pattern to a wafer substrate is analogous to a conventional photographic printing process. In the case of photo printing, a light beam passes through a film "negative" and through one or more enlarging lenses, to form an image on photosensitive paper, which is then chemically developed to produce a print of the image; in the case of optical lithography, a light beam passes through a quartz photomask, or "reticle" bearing a metallic circuit pattern, and through one or more reducing lenses, to form an image in a photosensitive material on a target substrate. The substrate may then be etched or otherwise chemically processed to transfer the image to an underlying layer of material. Each flaw in a reticle thus has the potential to affect mass production of a large number of electronic circuit chips.

Because the metal-patterned quartz reticle is exposed for long periods of time to small-wavelength, high-energy light in close proximity to a light source, the reticle tends to absorb heat, causing thermal expansion. If the thermal expansion occurs in a non-uniform manner, pattern dimensions on the reticle can become distorted. Non-uniform thermal expansion can occur, for example, if the density of the metal pattern is non-uniform across the reticle. Pattern density variations may be managed by establishing and enforcing circuit design rules during production of the reticle. However, as integrated circuit feature sizes shrink, there is less tolerance for change in reticle dimensions. In addition, use of a double-patterning technique (in which the same material layer is patterned a second time with new features aligned in-between existing features) is becoming more widespread, which results in tighter manufacturing requirements for overlay budgets. Measurement and control of reticle distortion thus can provide a competitive edge by enabling pattern-overlay capabilities that have greater accuracy and precision.

SUMMARY

The disclosure herein is directed to apparatus and methods for detecting and measuring thermally or mechanically induced reticle distortions in situ, thus enabling measurements of reticle distortion at the nanometer level. The techniques described use relatively simple optical detectors and digitizing signal acquisition electronics that are capable of monitoring distortions in real time, while the lithography equipment is in operation. Both the magnitude and the direction of reticle distortion can be measured at multiple locations on the reticle. Calibration of the detector response can be done using existing stage control and metrology techniques. Time-varying distortion of a reticle can be measured by reflecting or diffracting light focused to slit-like patterns of different orientations on the reticle as the reticle is scanned, detecting and recording the reflected or diffracted light, and comparing a segment of the recorded intensity with that measured earlier at the same reticle stage position.

According to representative embodiments, one or more optical beams are directed along a path incident to the surface of the reticle, which is securely mounted to a moveable stage. A scan of the substrate can be made by moving the reticle in a horizontal plane above the substrate. One disclosed embodiment allows for recording successive time measurements as the reticle scans the substrate. One or more detectors collect secondary light signals that are scattered or reflected from a chrome pattern on the reticle, or transmitted through the quartz reticle at locations where there is no chrome pattern. As the reticle scans, secondary intensity signals at the detectors vary with time, e.g., at a fast reticle-stage speed of 1 m/s, the detector signal may change at the nanosecond (ns) level. Detected secondary signals, though they can be very complex, are reproducible with stage position. Therefore, representative segments of the signals may be sampled and stored during a scan, and corresponding segments from successive reticle scans may be compared to identify temporal offsets in the scan signals that indicate thermal or mechanical distortion. Other embodiments disclosed use various types of optical interferometry to detect reticle distortion based on shifts in path length or phase of a diffracted signal.

In some examples, apparatus for in situ measurement of reticle distortion include a reticle scanning stage configured to retain a reticle so that a pattern defined on the reticle is situated in a reticle plane. At least one optical interrogation beam source is configured to provide an interrogation optical beam that is directed to the reticle plane. A corresponding photodetector is situated with respect to the reticle plane so as to receive at least a portion of the interrogation optical beam from the reticle plane based on interaction of the interrogation optical beam and the reticle pattern, and produce a corresponding reticle characteristic electrical signal. A signal processing system is coupled to the at least one photodetector so as to receive the reticle characteristic electrical signal, and based on the electrical characteristic signal, provide an indication of a reticle deformation. In some examples, the signal processor is configured to receive the reticle characteristic electrical signal as a function of time within a scan of the reticle stage, and the indication of the reticle deformation is based on variation in the reticle characteristic electrical signal as a function of time. Typically, the indication of the reticle deformation is based on variation in the reticle characteristic electrical signal as a function of time with respect to a reference signal or a variation from a reticle characteristic electrical signal obtained in a previous scan during exposure of the reticle. In representative examples, signal comparisons are based on cross-correlations. The reticle characteristic signal can be associated with direct detection, interferometric detection, or speckle detection.

Methods for detecting reticle distortion comprise directing at least one optical beam to be incident on the reticle as the reticle undergoes a scanning motion and detecting at least one segment of a secondary light signal associated with an interaction of the at least one optical beam and the reticle during at least a portion of a scan interval. Based on the detected segment, an extent of a reticle deformation is determined. In some examples, the extent of reticle deformation is based on a comparison of the segment with a reference segment obtained from a prior scan of the reticle. Typically, an exposure beam is directed to the reticle during acquisition of the detected segment. In some examples, the at least one segment is detected interferometrically, and a reference optical beam is provided. In other examples, the at least one segment is detected based on detected speckle. In some embodiments, an extent of a reticle deformation is determined based on comparisons of the detected segments. In some examples, the comparisons are based on correlation of detected segments. In additional examples, at least one temporal offset is determined based on the correlation of detected segments, and the determined extent of reticle deformation corresponds to a spatial displacement associated with the reticle.

These and other features and aspects of the disclosed technology are set forth below with reference to the accompanying drawings.

BRIEF DESCRIPTION OF THE DRAWINGS

FIG. 1 is a schematic diagram of a representative apparatus for monitoring reticle distortion.

FIGS. 2A-2B are plots of detected interrogation beam intensities as functions of time during segments of adjacent reticle scan intervals.

FIG. 4 is a block diagram of a representative method of comparing detected portions of an optical interrogation beam based on correlations.

FIGS. 11D-11I illustrate representative diamond-shaped illumination patterns that permit determination of distortion direction and magnitude.

DETAILED DESCRIPTION

Figure 3:
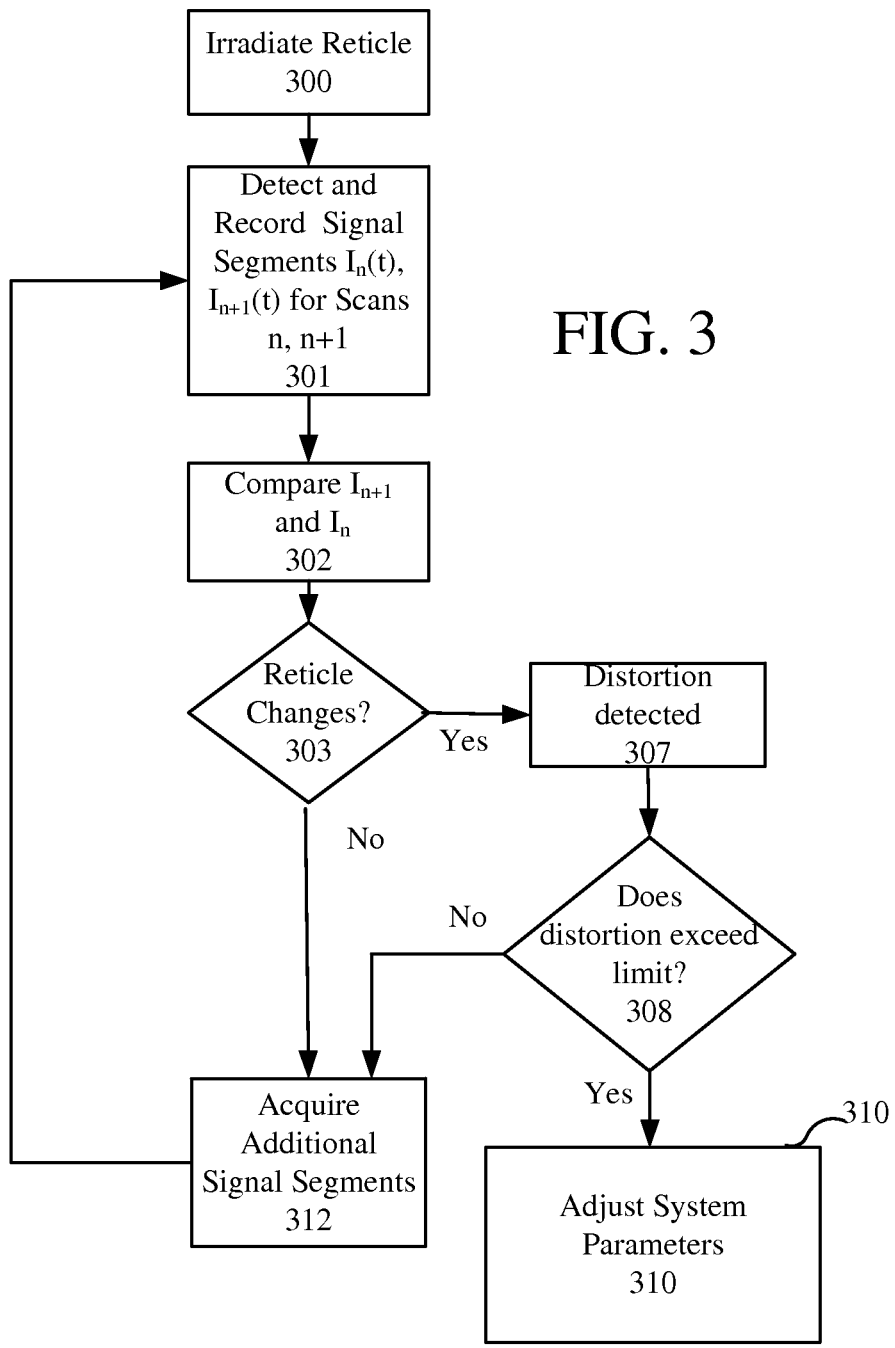
FIG. 3 is a block diagram of a representative method of measuring reticle distortion in situ based on detected portions of an optical interrogation beam acquired during reticle scanning.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, optical radiation is directed to and from a reticle or other surface. As used herein, optical radiation refers to electromagnetic radiation in a wavelength range of between about 5 nm and 2000 nm. In some examples, a reticle is irradiated with optical radiation in a first wavelength range in order to produce lithographic patterning, and a second wavelength range for interrogation of reticle deformation. For convenience, optical fluxes or beams intended for lithographic patterning are referred to herein as exposure fluxes or exposure beams. Optical fluxes or beams intended for reticle assessment are referred to as interrogation fluxes or interrogation beams. Either of such fluxes can be a narrow band or wide band flux, and polarized, partially polarized, and unpolarized fluxes can be used. In some examples, the fluxes are spatially and/or temporally coherent, and are provided by one or more lasers.

In some disclosed examples, reticle deformation such as that produced by heating associated with irradiation by a patterned beam can be assessed. As used herein, distortion refers to any reticle pattern shape or size change, or any shape, size, or spacing change of pattern elements on a reticle. Such distortion can be uniform or non-uniform, and the distortion can be isotropic or anisotropic. Typically, pattern exposures are made by moving a reticle with respect to a surface to be exposed to the reticle patterns. Such motion can be continuous, stepped, or a combination thereof. In some examples, a reticle is interrogated with an interrogation beam during scanning or with the reticle at rest.

FIG. 1 illustrates a representative reticle distortion measurement system 100 situated for in situ reticle distortion measurements. As shown in FIG. 1, a patterned reticle 102 is secured to a reticle stage 104 that is configured to be stepped, scanned or otherwise moved. In the example of FIG. 1, the reticle 102 can be scanned substantially in a horizontal plane in a y-direction based on xyz-coordinate axes 108. An x-axis extends out of the plane of FIG. 1, but is not shown. Typically, a chrome pattern 110 or other pattern on the reticle 102 is irradiated by an exposure source 112 in a wavelength range suitable for pattern transfer, and projection optics 114 form an image of the exposed portion of the reticle 102 on a sensitized substrate such as a photoresist coated wafer 105 that is situated on a wafer stage 107. For convenient illustration, other components associated with pattern-transfer from the reticle 102 to a wafer are either omitted or are shown schematically in FIG. 1. Additionally, the reticle 102 is shown as a reflective element. In other configurations the reticle is transmissive, with light from the exposure source 112 passing through the reticle to the projection optics 114.

An interrogation optical beam 111 from an interrogation beam source 118 is directed along an interrogation beam axis 116 to the reticle 102, and detectors 120, 122, 124 are situated along respective detection axes 128, 130, 132 so as to capture portions of the interrogation beam 111 that are reflected, refracted, diffracted, transmitted or otherwise directed as "secondary" optical signals, to a respective detector. Such secondary signals are also referred to as reticle modulated interrogation beams. A plurality of detectors is shown in FIG. 1, but one or more detectors can be used, and detector position can be selected as convenient, and may be dependent on the reticle 102. The interrogation beam 111 can be a coherent or incoherent beam, but typically coherent optical radiation is convenient. The interrogation beam source 118 can include a laser, lamp, light emitting diode or other optical radiation source. For example, a laser source that produces a laser beam in a visible wavelength range (typically between about 400 nm and 700 nm) can be used, or portions of the optical radiation used in pattern transfer and provided by the exposure source 112 can be used. In some examples, reticle distortions can be associated with diffractive effects, so that longer wavelengths with greater diffraction angles can provide superior results. The locations and orientations of the interrogation beam axis 116 and detector axes 128, 130, 132 are provided as examples only, and other arrangements can be used as may be convenient. The interrogation beam 111 generally propagates in a fixed direction to a reticle surface and the reticle 102 is scanned through the interrogation beam 111.

The detectors 118, 120, 122 can be provided with respective collection lenses 129, 131, 133 to, for example, increase collection efficiency of radiation from the interrogation beam. The detectors 120, 122 are situated to receive diffracted, scattered, or specularly reflected portions of the interrogation beam 111 and the detector 124 is situated to receive portions of the interrogation beam 111 that are scattered, diffracted, or otherwise transmitted by the reticle 102. In FIG. 1, the detector 120 is provided with an actuator 121 configured to displace the detector 120 along the axis 128 in order to compensate z-directed displacements of the reticle 102 that can be made to increase an apparent depth of field (DOF) in imaging the reticle 102 onto the substrate 105. Other detectors can be similarly provided with actuators. In the example of FIG. 1, three detectors are provided, but one, two, three or more detectors can be used as preferred. The collection lenses 129, 131, 133 are shown as single element lenses, but in other examples, collection optics can be provided that have multi-element lenses, mirrors, or other reflective or refractive optical elements or combinations thereof, and optical filters or polarizers can be used to attenuate unwanted optical radiation that can reach the detectors. For example, filters can be provided to block or attenuate any scattered or other portions of the exposure beam that might otherwise reach one or more of the detectors 128, 130, 132.

The detectors 128, 130, 132 are coupled to a data acquisition unit 134 that generally includes optical detection electronics such as amplifiers, electrical filters, analog-to-digital convertors and other components configured to process detector output signals and produce corresponding electrical signals that can be stored in a memory as recorded signals. The data acquisition unit 134 can be configured to include a computer readable medium such as memory for storage of recorded signals or for communication of the recorded signals to a controller 136 for analysis and processing. The controller 136 can be provided as a dedicated control computer, a desktop computer, a laptop computer, or other portable or non-portable processing system. The controller need not be co-located with the optical system and exposure and interrogation sources, but can be coupled so as to communicate via a local or wide area network using, for example, an ethernet or other network protocol.

The controller 136 is also coupled so as to control reticle and substrate positioning such as scanning or stepping of the reticle 102 and/or the substrate, typically via corresponding stages such as the reticle stage 104. The controller 136 can be provided as a computer or other processor that includes computer executable instructions for reticle and substrate positioning, scanning, data acquisition, and processing as well as communicating reticle assessments to a user. The controller 136 typically includes storage devices or storage media such as, for example, hard disks, RAM, ROM, or other computer memory that is configured to store data such as recorded signals and computer-executable instructions for operation and control.

The controller 136 is configured to store recorded detector signals associated with the detectors 128, 130, 132 with reference to reticle positions. Typically, the recorded detector signals are referenced to reticle scan times so that recorded signals are available as function of time during reticle scanning. Reticle scanning is generally repetitive, i.e., the same portions of the reticle 102 are exposed in sequential scans, and accordingly, recorded detector signals are available for sequential scans. Scan-to-scan variations in recorded detector signals (or variations from initial measurement prior to any scanning) can be used to detect or assess reticle changes during scanning, such as reticle distortions due to thermal effects produced by irradiation with the exposure beam. If successive scans are entirely repetitive, electrical signals from successive scans will be compared at the same elapsed time from scan initiation. However small changes to the scanning profile may occur, so that the reticle may be at slightly different locations at the same elapsed time for successive scans. The controller 136 can be used to correct the elapsed times so that the reticle is interrogated at the same reticle position.

In the example of FIG. 1, the detectors 128, 130, 132 are configured to produce electrical signals based on received optical intensities from the reticle 102 associated with the interrogation beam 111. In other examples discussed below, the detectors are configured to produce electrical signals based on optical interference such as dual beam interferometry or speckle. In some cases, each or selected ones of multiple detectors can be configured to provide one or more electrical signals based on direct detection, speckle, or beam interference.

FIGS. 2A-2B show example detector signals $I_n$, $I_{n+1}$ recorded during identical segments of consecutive scans. Times $t_n$ and $t_{n+1}$ are the times during respective scans at which recording of the segments started, and are generally selected so that detector signals are associated with exactly the same regions of the reticle for the two scans, barring reticle distortion. As shown in FIGS. 2A-2B magnitudes of detector signal intensities associated with a selected detector are plotted as a function of elapsed time from respective scan initiation times $t_n$, $t_{n+1}$, respectively, for an $n^{th}$ and an $n+1^{st}$ scan, as intensity curves 202, 204. In this example, a recorded signal is obtained for each of these scans individually, but a continuously recorded signal can be divided into portions (i.e., signal segments) that can be associated with particular scans and elapsed time within such scans.

In the absence of any deformation in the reticle or other variation in scans, detector signals such as those graphed in FIGS. 2A-2B should be substantially the same. However, as shown in FIGS. 2A-2B, the curves 202, 204 are horizontally offset by a temporal offset time Δt which indicates reticle changes have occurred between the corresponding scans. Because thermal effects produced by exposure beam heating can be relatively small (even if larger than desirable for high resolution lithography), curves such as the curves 202, 204 tend to be similar in appearance. However, a processing system such as the controller 136 can be configured to process two or more recorded signals and, based on differences in corresponding signals, provide an indication of reticle changes.

For recorded signals that exhibit a temporal offset, an estimate of a corresponding reticle pattern feature shift in a scan direction can be obtained, based on a reticle scan speed V and the temporal offset Δt as a product VΔt. For example, if V=1 m/s, a temporal offset of 1 ns corresponds to, and indicates, a reticle displacement of 1 nm. A temporal offset of 1 ns is directly resolvable if detector intensities are recorded at sampling rates of 1 Gsample/sec, but acquisition at lower sampling rates can be used and temporal offsets determined by interpolation or other processes. However, temporal offset determination can be limited by both the stage speed V and the spatial resolution δx of collection lenses/detector combinations. For example, a secondary beam such as a diffracted or reflected portion of the interrogation radiation originating at a reticle is received at a point detector or slit detector with slit orientation normal to a reticle stage travel direction for a duration of approximately δx/V. If the point spread function at a detector is about 1 μm and the reticle stage speed is about 1 m/s, the secondary beam can persist on the detector for approximately 1 μs. Increasing the detector slit size worsens the time resolution so that small area detectors can be preferred, especially for temporal resolutions approaching 1 ns. In addition, when evaluating distortion based on an interrogation beam, reticle-scanning system irregularities can appear as reticle distortions and mechanically stable scanning is preferred so that the reticle stage location may be repeatably determined. However, repetitive errors (i.e., repeatable errors) can be identified as such, and discarded in assessing exposure induced reticle distortions.

Determination of reticle distortion based on representative recorded detector signal segments $I_n$ and $I_{n+1}$ is illustrated in FIG. 3. Reticle irradiation with both pattern transfer and interrogation beams is initiated at 300, and interrogation signal segments $I_n$ and $I_{n+1}$ are recorded at 301 for an $n^{th}$ and an $n+1^{th}$ scan. Typically, such signal segments are based on portions of the scan duration. At 302, the signal segments are compared. If changes are detected at 303, distortion is noted as detected at 307. If distortion is determined to exceed a limit such as a warning limit at 308, a warning is provided, pattern transfer is halted, or system operating parameters such as, e.g., scan, reticle height, wafer height, or focus are adjusted at 310. Otherwise signal segments for a different value of n are obtained at 312 and the distortion evaluation is repeated. Signal segment comparison can be based on signal segment amplitudes, phases, temporal offsets, shapes, or other signal characteristics.

The types of signal differences in signal segments can depend on the shapes, sizes, orientations, and densities of pattern features on the reticle, detector position(s), the types of optical signals received by detectors, and types of reticle deformation. For example, if a reticle experiences a thermal expansion or contraction, the relative position of pattern features can change from scan to scan. Such relative position changes can appear as temporal offsets for detector signal segments associated with different scans such as shown in FIGS. 2A-2B. Such detector signal segments can exhibit other differences associated with reticle deformations. For example, detector signal segments can vary as a function of time corresponding to differing reticle pattern feature spacings as a function of exposure. However, the disclosed methods are not limited to any particular type or reticle change or deformation.

Temporal offsets or other changes in signal segments can be conveniently assessed by processing signal segments to obtain cross-correlations. To this end, a general purpose controller (such as the controller 136 of FIG. 1) can be configured as a signal processor or a separate, dedicated signal processor can be used. For example, a processor such as a general purpose or dedicated processor can be provided with computer-executable instructions for such cross-correlations. In some examples, computer-executable instructions are provided for obtaining Fourier transforms of recorded signals so that cross-correlations of first and second signal segments can be conveniently determined based on products of Fourier transforms associated with the signal segments. The cross-correlation can then be found based on an inverse Fourier transform of the product. Such an approach can provide more efficient computation. In a typical method as shown in FIG. 4, recorded interrogation signals such as $I_n$ and $I_{n+1}$ are obtained at 402, and a cross-correlation is calculated at 404. At 406 the cross-correlation is evaluated, and at 408 possible distortion (or a lack of distortion) is reported. In some examples, the cross-correlation provides an estimate of a magnitude and direction of a pattern displacement. Although in this example sequential interrogation signals for an $n^{th}$ and an $(n+1)^{th}$ scan are used, non-sequential scans can be used, and at least one signal can be associated with a reticle that is not receiving an exposure beam, or that is otherwise thought to be free of thermal or other distortions.

Figure 12:
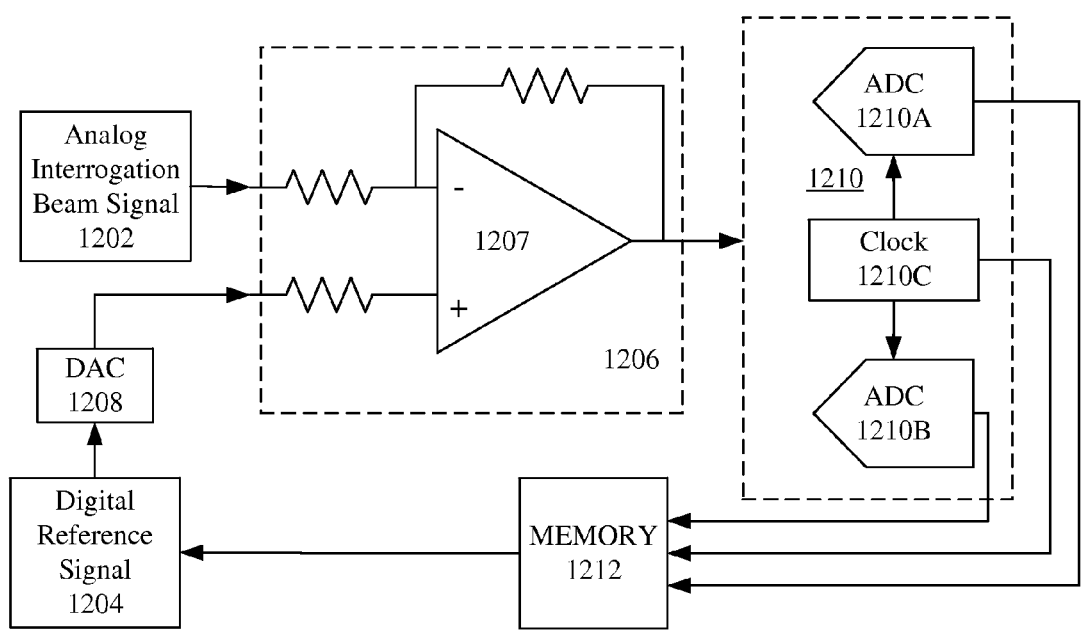
FIG. 12 illustrates acquisition of an electrical signal based on detection of optical interrogation signal.

Generally scan-to-scan variations in detected portions of the interrogation beam associated with distortion are small. In digitally recording such signals, it can be preferable to record a difference between a detected signal and a reference signal. The reference signal can be recorded and then provided to a digital to analog converter (DAC). Referring to FIG. 12, an electrical signal associated with a portion of an interrogation beam detected at a photodetector is provided to a differential amplifier 1206 from, for example, a photodetector amplifier 1202. The differential amplifier 1206 as illustrated is based on an operational amplifier 1207, but other amplifiers could be used. A digital reference signal source 1204 is coupled to a DAC 1208 whose analog output is coupled to the differential amplifier 1206. The differential amplifier 1206 produces a difference signal based on a difference between the DAC output and the analog interrogation beam signal. The difference signal is digitized by an Analog-to-Digital converter (ADC) 1210 and stored in a memory 1212. As shown in FIG. 12, the ADC 1210 includes interleaved ADCs 1210A, 1210B that can provide increased temporal resolution based on phase difference in acquisition signals from a clock source 1210C, but a single ADC can be used. As noted above, recording optical signals are referenced to scan times, but scan time references are not shown in FIG. 12 for clarity.

Diffractive Interrogation Signals

In some examples, reticle pattern features can produce detectable diffracted optical beams in response to an input interrogation beam. Magnitudes of scattered or reflected portions of the interrogation beam are generally based on pattern density within an irradiated region of the reticle. Small, repetitive chrome patterns that have a substantially constant pattern density may fail to produce noticeable changes in diffracted light intensity as scanned through an interrogation beam, and provide limited contrast which may make feature identification and distortion detection difficult. However, in scanning reticle areas in which pattern density in the irradiated reticle region changes substantially, (e.g., when a feature having a large chrome surface area, such as an electrical contact pad, is exposed), changes in diffraction patterns and diffracted beam intensities associated with reticle deformation can be more readily detected. For applications in which diffracted interrogation beams are to be detected, optical detectors can be situated away from directions associated with reflection or transmission of an interrogation beam. In general, diffraction intensity remains substantially constant with scanning of a diffraction grating-like pattern feature through the interrogation beam, so stage-motion effects do not interfere with obtaining diffraction measurements in this manner. Diffracted light scattering intensity from a given reticle pattern generally depends with the wavelength of the interrogation beam, and diffraction angles are proportional to wavelength so that longer wavelengths can be preferred.

Diffraction from a one-dimensional grating is described by the grating equation:

$$m\lambda/p = n_d \sin \theta_m - n_i \sin \theta_i,$$

wherein m is a diffraction order m=0, ±1, ±2, . . . , $\lambda$ is wavelength, p is a grating pitch (i.e., spacing of features), $\theta_i$ is an angle of incidence, $\theta_m$ is a diffraction angle for an $m^{th}$ diffraction order, nd is an index of refraction of the diffraction medium, and $n_i$ is an index of refraction of the medium of incidence. Because either the incident flux, or the diffracted flux, or both may pass through the reticle, both $n_d$ and $n_i$ may be greater than 1.0. If the spacing between grating slits p is less than $\lambda/(\max(n_d, n_i) + n_i \sin \theta_i)$, the only substantially diffracted order is m=0, so $n_d \sin \theta_m = n_i \sin \theta_i$, and little or no diffractive modulation of the intensity signal occurs. However, when conditions permit non-zero diffraction orders, a diffraction pattern is created, a portion of which can be intercepted by a detector, typically placed so as not to receive specular reflections or direct transmission.

Figure 5:
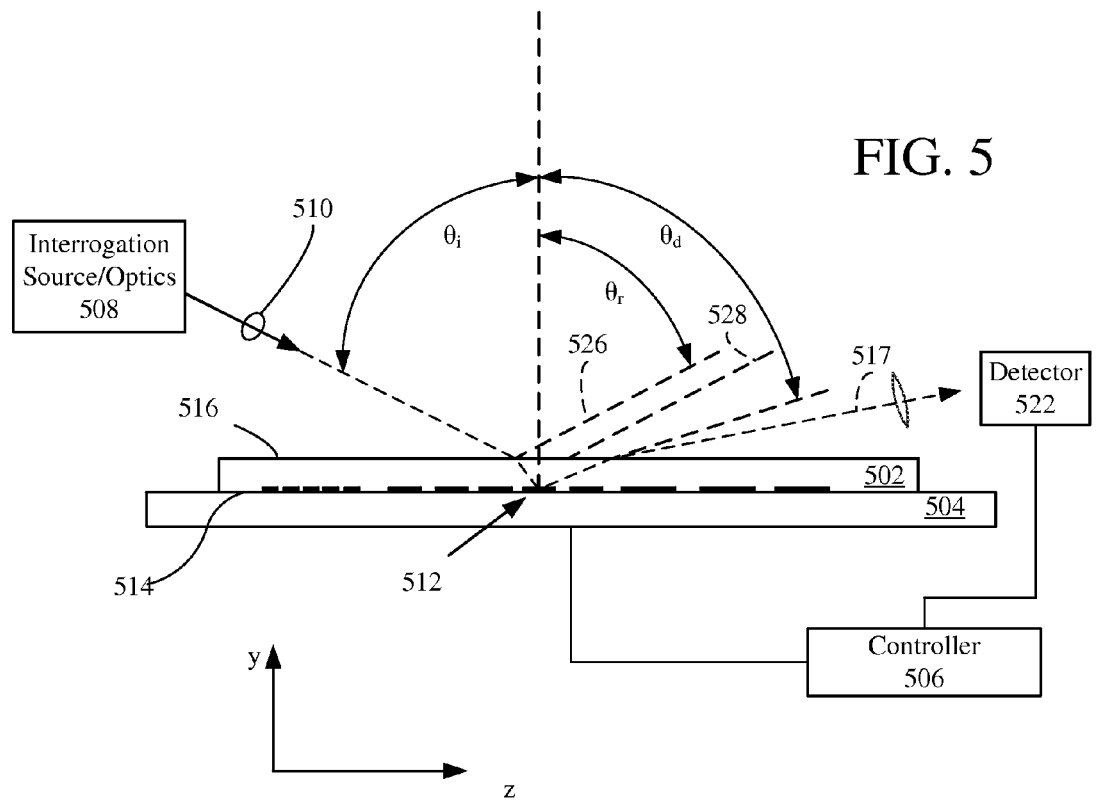
FIG. 5 is a schematic diagram of a representative apparatus for monitoring reticle distortion based on diffraction of an interrogation optical beam by a portion of a pattern defined on a reticle.

FIG. 5 illustrates a portion of an apparatus configured to detect or assess reticle deformations by detecting diffracted portions of an interrogation beam. As shown in FIG. 5, a reticle 502 is situated on stage 504 that is coupled to a controller 506 that provides suitable electrical signals for scanning of the stage 504. An interrogation source 508 directs an interrogation beam 510 to the reticle 502 and in particular to a portion 512 of a pattern defined on a surface of the reticle 502. As shown in FIG. 5, the pattern 512 is on a back surface 514 of the reticle 502 but can be on a front surface 516 instead. The interrogation beam 510 is refracted at the front surface 516 and then diffracted at least in part into a particular diffraction order that propagates along an axis 517 to a detector 522. An angle of incidence $\theta_i$ and an angle of diffraction $\theta_d$ satisfy the diffraction condition set forth above. Axes 526, 528 are associated with reflection at the front surface 516 at an angle $\theta_r$ and the back surface 514 of the reticle 502. The detector 522 can be situated so as to be displaced from the axes 526, 528 so as to avoid detecting reflected portions of the interrogation beam, one or more additional detectors can be provided for detecting reflected portions, or the detector 522 can be situated so as to receive both reflected and diffracted portions. Various collection and beam forming optics such as lenses, mirrors, and diffractive optical elements can be used, and filters such as holographic or dielectric filters, polarizers, or absorptive filters can be used to attenuate undesired radiation from reaching a detector. Although the reticle 502 is shown with a pattern on a back surface, a reticle can include a front surface pattern that is directly exposed to an interrogation beam, without transmission by a reticle substrate.

Figure 6:
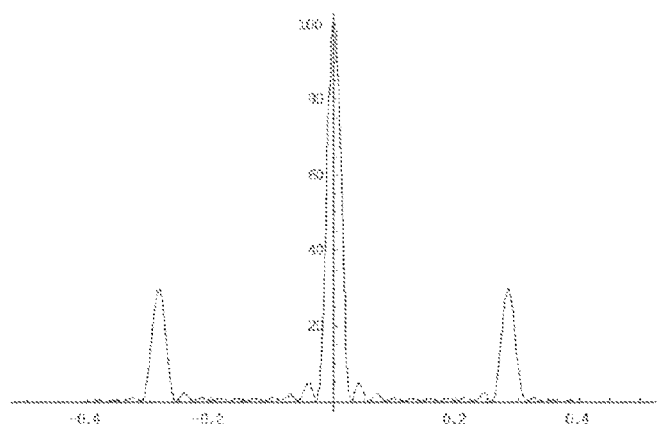
FIG. 6 is a plot of relative diffracted optical intensity as a function of diffraction angle.

Diffraction of an interrogation beam by a periodic pattern similar to a diffraction grating on a reticle can be described based on an electric field strength $U(x_0, y_0)$ in a far field approximation as:

$$U(x_0, y_0) = a\,\text{sinc}\left(\frac{y_c a}{\lambda z_0}\right) \frac{\sin\left(\frac{N\pi y_0 d}{\lambda z_0}\right)}{\sin\left(\frac{\pi y_0 d}{\lambda z_0}\right)} \exp\left(-i\frac{2\pi y_0 C(t)}{\lambda z_0}\right),$$

wherein d is a grating slit spacing (d=1/p), a is slit width, $\lambda$ is an irradiation wavelength, N is a number of irradiated slits, $x_0$, $y_0$, and $z_0$ are spatial coordinates, C(t) is phase factor, and constant factors are omitted. Scanning of a periodic pattern that produces such a field strength does not necessarily produce substantial variations in $U(x_0, y_0)$, although a number of slits N irradiated can vary by one during scanning. A simplified diffraction pattern 602 is illustrated in FIG. 6, wherein $\lambda$=500 nm, slit width a=1 μm and slit spacing d=1.752 μm and a number of slits N=10. A detector can be situated so as to detect any portion of this diffracted intensity to permit reticle distortion detection.

Phase-Sensitive Interrogation Signals

Diffraction based interrogation as described above is based on detected intensities, i.e. $|U(x_0, y_0)|^2$, and is not dependent on the phase term C(t). As the reticle is scanned, the number of slits irradiated can change, but the resulting intensity modulation of the diffracted optical signal is generally weak.

In some cases, the phase factor C(t) can be used to detected reticle distortions. C(t) is based on a position of a reticle pattern such as the pattern 512 with respect to the detector 522 at time t. Phase information such as C(t) can be captured by interfering the diffracted optical intensity with a second coherent beam as shown in FIG. 7.

Figure 7:
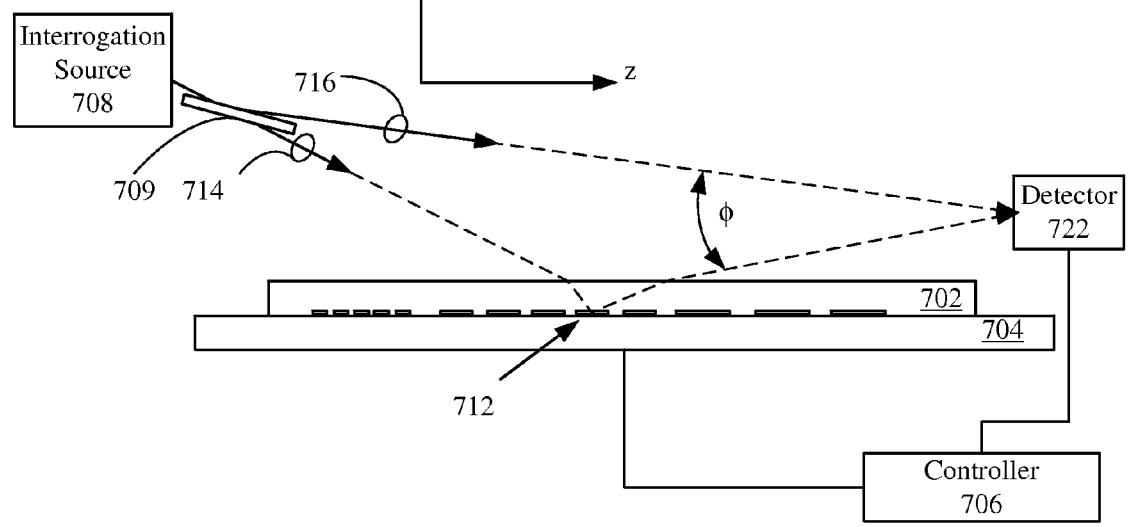
FIG. 7 is a schematic diagram of a representative apparatus for monitoring reticle distortion based on interferometric detection of an interaction of an interrogation optical beam with a reticle.

With reference to FIG. 7, an interrogation beam source 708 directs an interrogation flux to a beam splitter 709 that produces a first interrogation beam 714 and a second interrogation beam 716. The first interrogation beam 714 is directed to a reticle 702 on which a pattern 712 is defined, and a diffracted, reflected, or other portion of the first interrogation beam is directed to a detector 722. The second beam 716 is directed to the detector 722 so as to interfere with the portion of the first interrogation beam that reaches the detector 722. The interrogation beam source 708 provides an interrogation beam having sufficient coherence so that interference is produced at the detector 722.

The reticle 702 is secured to a moveable stage 704 that is scanned based on a scanning signal provide by a controller 706. The controller 706 is also coupled to the detector 722 so that optical interference patterns can be recorded as a function of time during reticle scanning for subsequent processing. One or more collection optical elements (e.g., lenses, mirrors, and the like) may be placed in front of the detector 722 to, for example, increase radiation collection efficiency. Collection elements can be single element lenses, but in other examples collection optics can be provided with multi-element lenses, mirrors, or other reflective or refractive optical elements or a combination thereof, and optical filters or polarizers can be used to attenuate unwanted optical radiation that can reach the detector 722. The first and second interrogation beams can be provided by dividing a single beam into two beams, or separate sources which are coherently related can be used.

Total interrogation beam amplitude at the detector 722 at a height yo above the reticle plane can be expressed as:

$$U_h(x_0, y_0) = a\,\text{sinc}\left(\frac{y_0 a}{\lambda z_0}\right) \frac{\sin\left(\frac{N\pi y_0 d}{\lambda z_0}\right)}{\sin\left(\frac{\pi y_0 d}{\lambda z_0}\right)} \exp\left(-i\frac{2\pi y_0 C(t)}{\lambda z_0}\right) + A\exp\left(-i\frac{2\pi y_c \sin\phi}{\lambda}\right),$$

wherein a, N, $\lambda$, d, and C(t) are defined above, A is a constant, and $\phi$ is an angle between the first and second reference beams propagating to the detector 722. The corresponding intensity at the detector 722 is I=|U(x$_0$, y$_0$)|$^2$, which is given by:

$$I_h(t) = D^2 + A^2 + 2AD\cos\left(\frac{2\pi y_0}{\lambda}\left(\frac{C(t)}{z_0} - \sin\phi\right)\right),$$

wherein $$D = a\,\text{sinc}\left(\frac{y_0 a}{\lambda z_0}\right) \frac{\sin\left(\frac{N\pi y_0 d}{\lambda z_0}\right)}{\sin\left(\frac{\pi y_0 d}{\lambda z_0}\right)},$$

and wherein the sinc function is defined as sinc(x)=sin($\pi$x)/$\pi$x. Thus, as the stage 704 moves and scans the reticle 702, C(t) steadily increases (or decreases) and the intensity changes cosinusoidally. The detector 722 receives this optical intensity and produces a corresponding electrical signal that can be recorded.

Figure 8:
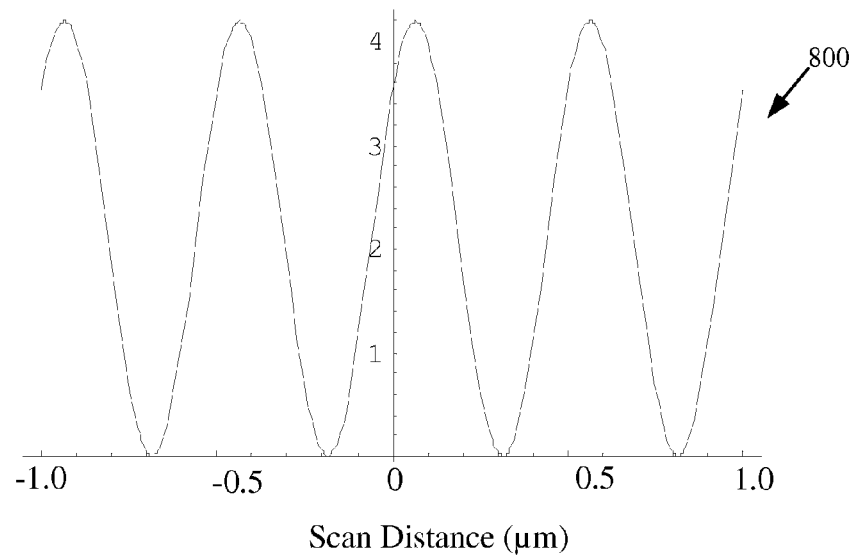
FIG. 8 is a graph illustrating a representative interferometric signal obtained using an apparatus such as that of FIG. 7.

An example of a detected signal 800 captured at an interferometric detector such as the detector 722 is shown in FIG. 8. In this example, a detector signal was estimated with $\phi$=10°, y$_0$=0.1 m, and z$_0$=1.0 m. Under these conditions, excellent contrast can be achieved. For a stage speed V=1.0 m/s, the signal changes at the sub-microsecond level, which is sufficient to resolve sub-nm range distortion. Such a detected optical signal can be referred to as "hologram contrast" signal, because it is obtained with a layout similar to a layout for making holograms.

Figure 9:
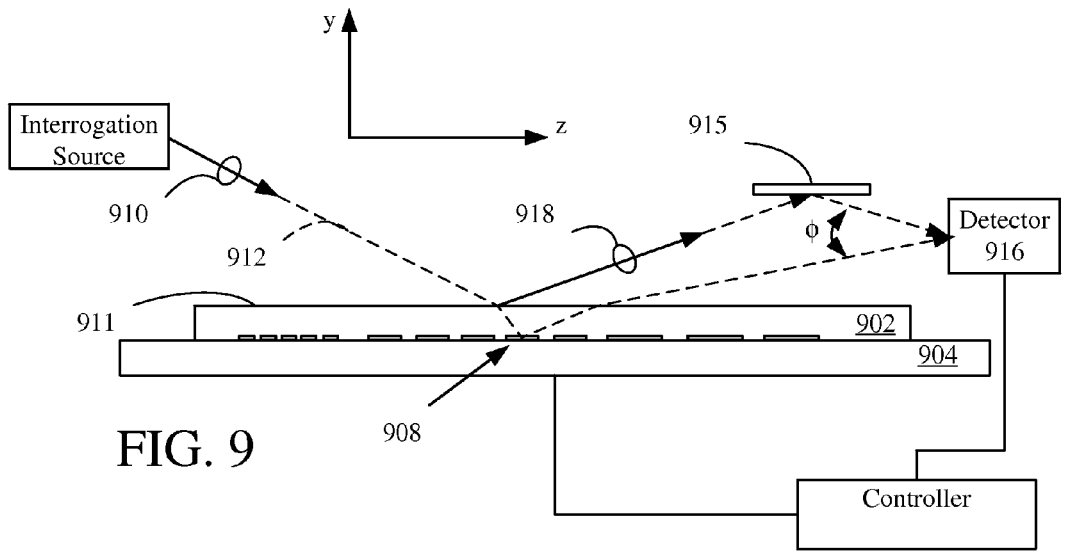
FIG. 9 is a schematic diagram of a representative apparatus for monitoring reticle distortion based on interferometric detection of an interaction of an interrogation optical beam with a reticle in which a reference beam is obtained by reflection of a portion of an interrogation optical beam.

Under certain conditions, a reference interrogation beam can be provided as a reflected beam from a reticle surface. With reference to FIG. 9, an interrogation optical beam 910 is directed along an irradiation axis 912 to a reticle 902 that is secured to a moveable stage 904. Portions of the interrogation optical beam are scattered, diffracted, or reflected from a periodic pattern 908 on the reticle 902, and are directed to and detected by a detector 916. A portion of the interrogation optical beam 910 is reflected at a reticle surface 911 and directed to the detector 916 by a reflector 915. At the detector 916, the reflected interrogation beam 918 interferes with the portion of interrogation beam received from and modulated by the pattern 908. Additional optical elements can be provided as discussed above, but are omitted from FIG. 9 for clarity.

Speckle Detection

Changes in speckle patterns from scan to scan can also be used to detect reticle deformations. Small variations in surface topography such as surface roughness can produce a high contrast speckle pattern when exposed to a coherent light flux. The granularity of a speckle pattern is typically comparable to the resolution of an imaging optical system. Thus, an imaging optical system having approximately micron resolution can produce high contrast speckle patterns with intensity variation on a micron scale. Therefore, the methods described above with respect to FIGS. 1-4 can be used with speckle-based signals to determine distortions.

Pattern Features for Distortion Determination

Figure 11A:
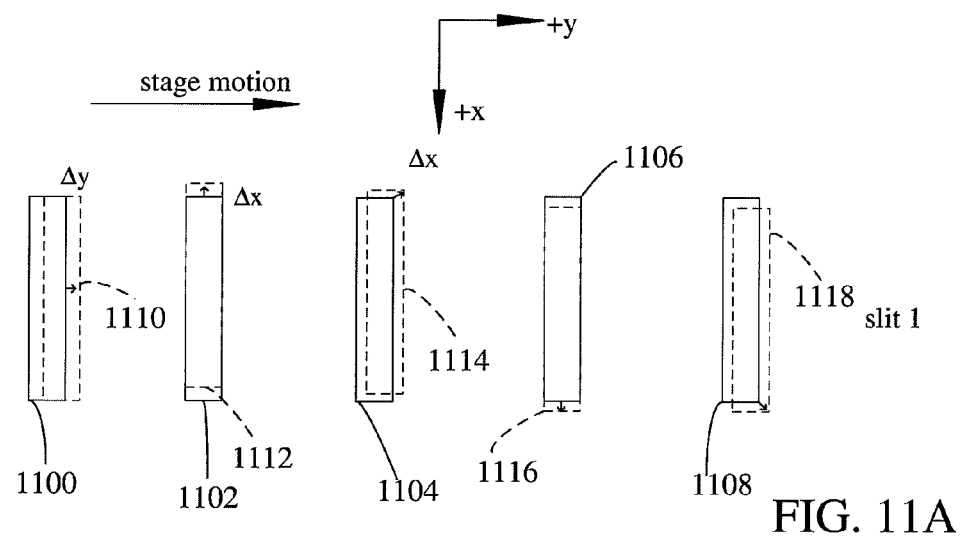
FIGS. 11A-11C illustrate representative slit illumination patterns that permit determination of distortion direction and magnitude.
Figure 11B:
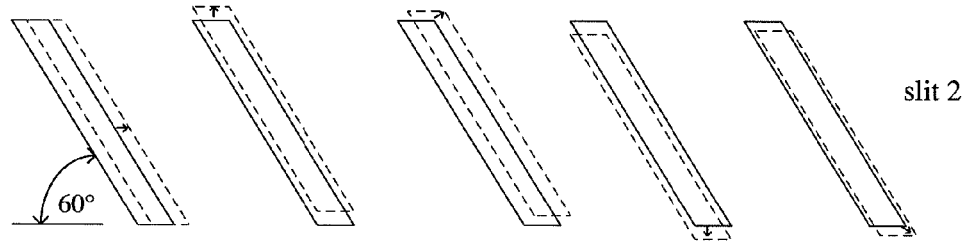
Figure 11C:
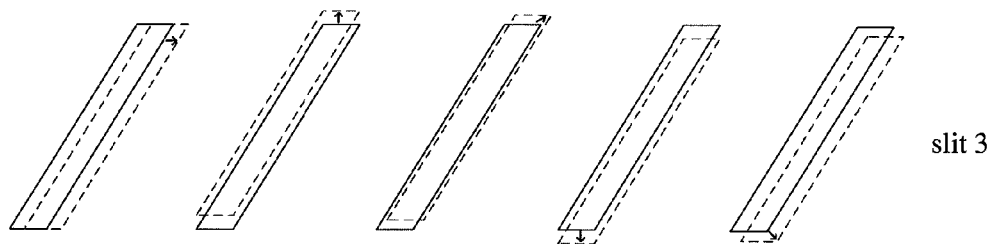

While reticle distortion can be assessed based on pattern features to be transferred to a sensitized substrate in the lithographic process, specialized distortion detection features can also be provided for this purpose. For example, for detection of reticle distortion in a scan direction (e.g., a y-direction) as shown in FIG. 11A, a slit illumination pattern 1100 extending along an x-axis can be used. It can also be advantageous to measure distortion in a direction orthogonal to stage motion (i.e., the x-direction). If a reticle stage has even a small motion, or a "short stroke" in the x-direction, the methods described above are applicable. However, in practice, a short x-direction stroke may preclude reaching a sufficiently high stage velocity (for example, 1 m/s) for obtaining sufficiently reliable distortion measurements. A short x-direction stroke may also interfere with normal lithography operation. An alternative method of determining both x- and y-components of distortion while limiting stage motion to a long-stroke y-direction can use successive measurements of the distortion of test slit illumination patterns or similar illumination patterns that are oriented in different directions. Representative patterns are illustrated in FIGS. 11A-11C which also depict displacements of various test slit patterns at different orientations, corresponding to a reticle pattern distortions in different directions.

Referring to FIG. 11A, a rectangular slit illumination pattern (referred to as "slit 1") is elongated along the x-direction and has a long side that is perpendicular to a scan direction (y-direction). After the reticle experiences some distortion, the slit illumination pattern is shown as a +y-displaced slit pattern 1110, a +x-displaced slit pattern 1112, diagonally displaced slit patterns 1114, 1118, and a −x displaced slit pattern 1116 with reference to undisplaced slit pattern locations 1100, 1102, 1104, 1108, 1106, respectively. As is apparent, beam modulations associated with small pattern shifts in the x-direction can be made negligible with sufficiently long, narrow slits. FIGS. 11B-11C show corresponding displacements of diagonally configured slit patterns. In the examples of FIGS. 11B-11C, elongated, parallelogram-shaped slit patterns are oriented at +60 degrees and −60 degrees, with respect to the scan direction but having the same x-direction height of the pattern of FIG. 11A. Orientations of the slit patterns at angles other than 60 degrees can also be used. Relative distortion contributions can be estimated based on a long dimension of the pattern projected parallel to a scan direction. Contributions associated with short slit dimensions (along the y-axis in this example) can be discounted as slits are assumed to be narrow. In other examples, slit patterns can be arranged at other orientations. By comparing relative temporal offsets associated with differently oriented slits, a magnitude and a direction of distortion can be estimated. Since distortion is characterized by two quantities, magnitude and direction, three measurements, each measurement based on different slit orientations, are sufficient, although additional measurements with slits in other directions may be useful as well. Table 1 lists distortion contributions associated with simultaneous measurements of the temporal offsets in different distortion directions for the slit configurations of FIGS. 11A-11C in arbitrary units.

| Relative distortion contributions associated with slit patterns arranged in different orientations | | | |
|---|---|---|---|
| Distortion direction relative to stage direction | Slit 1 | Slit 2 | Slit 3 |
| 0 | 4 | 4 | 4 |
| +45 deg | 2.83 | 4.46 | 1.27 |
| −45 deg | 2.83 | 1.27 | 4.46 |
| 90 deg | 0 | 2.31 | −2.31 |

In the above table, it was assumed that slit patterns 1, 2, and 3 were displaced and that associated interrogation signals were captured at substantially the same time. An implicit assumption is that the distortion is substantially uniform over the region of the reticle exposed by the array of slit images, so that each slit experiences substantially the same distortion. Alternatively, the slits can be at the same x-location and experience a displacement in the y-direction. The group of slits can sample the same reticle region by capturing signals at sequential times when each slit sees the same reticle region. If the stage moves additionally in the x-direction, the responses of the slit detectors to distortions of different magnitudes and directions can be calibrated using precisely controlled stage motions in different directions.

Other illumination patterns can be used as well. For example, FIGS. 11D-11I show an elongated diamond-shaped pattern 1130 arranged in two different orientations with various reticle displacements such as shown in FIGS. 11A-11C. Such a pattern or other asymmetric pattern (or combinations of such patterns) can be used in estimating distortion direction and magnitude. Patterns that are asymmetric generally permit evaluation of displacements and distortion in a scan direction and a direction perpendicular to a scan direction.

Direct Measurement of Distortion

Figure 10:
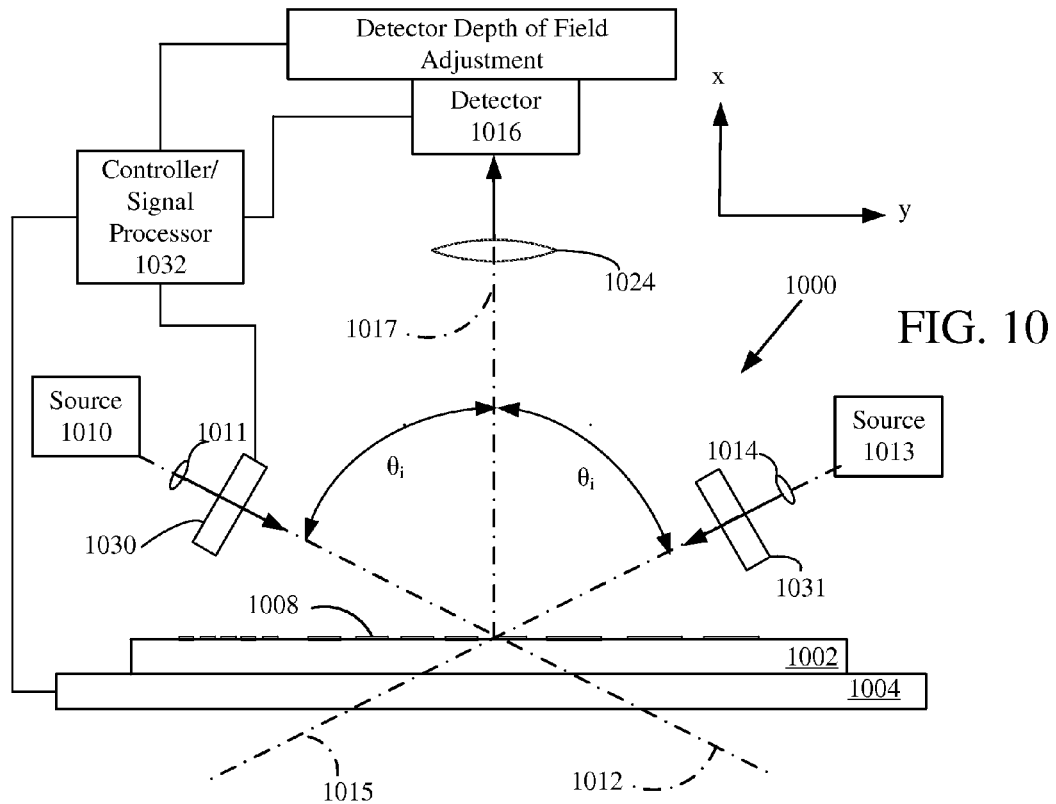
FIG. 10 is a schematic diagram of a speckle interferometry apparatus for detecting reticle distortion using two laser beams that are coincident on a reticle pattern.

A speckle interferometry apparatus 1000 as illustrated in FIG. 10, may be used to detect distortion of a reticle 1002 secured to a moveable stage 1004. The speckle interferometry apparatus 1000 includes a first interrogation beam source 1010 that is configured to direct a first interrogation beam 1011 along a first interrogation axis 1012 at an angle of incidence $\theta_i$ to a chrome reticle pattern 1008. Alternatively the interrogation beams may be directed to the side of the reticle obverse to the chrome pattern, and the speckle pattern created from small variations in the reticle substrate surface finish. A second interrogation beam source 1013 is configured to direct a second interrogation beam 1014 along a second interrogation axis 1015 at an angle of incidence $\theta_i$ to the chrome reticle pattern 1008 so as that at least portions of the first and second interrogation beams overlap at the reticle pattern 1008, and the planes of incidence of beams 1011 and 1014 are the same. The two interrogation beams have a fixed coherent relation to one another and are preferably derived from a single laser. A detector 1016 is situated along an axis 1017 and is configured to receive portions of the first and second interrogation beams from the reticle 1002 and produce a detected signal corresponding to a combined speckle interference pattern associated with speckle produced by each of the interrogation beams. A lens 1024 is situated long the axis 1017 so as to image the reticle pattern 1008 on the detector 1016. One or more other optical elements (e.g., lenses, mirrors, and the like) may be placed in front of the detector 1016 to, for example, increase radiation collection efficiency. Phase shift elements 1030, 1031 are situated on the axes 1012, 1015 so as to modulate the phase of the beams 1011, respectively. In the following, two assumptions are made: the amount of reticle distortion created is smaller than a typical speckle feature; and the amount of distortion does not vary over the field of view of the detector 1016.

The intensity of the speckle pattern at the detector 1016 can be written as $$I = A + B \cos(\Psi),$$

wherein A, B are intensities associated with the portions of the first and second interrogation beams directed to the detector 1016, and $\Psi$ is a phase term that varies from point to point on the reticle 1002 but remains constant at a given time during the scan absent reticle deformation. If the reticle 1002 is displaced laterally by a distance $\Delta y$ which lies in the plane of incidence of light beams 1011 and 1014, and is preferably aligned with the reticle stage scan direction, there is an additional phase term $2k\Delta y \sin(\theta_i)$ so that the intensity becomes:

$$I = A + B \cos(\Psi + 2k\Delta y \sin(\theta_i)),$$

wherein $k = 2\pi/\lambda$.

The phase terms and $\Psi$ and $2k\Delta y \sin(\theta_i)$ can be measured using phase shift interferometry. A plurality of calibration phase shifts $\phi_i$ are introduced into one of the two incident beams (1011, 1014) by a respective one of the phase modulators 1030, 1031 and the associated intensities $I_i$ at the detector 1016 recorded. In the absence of reticle distortion, $\Delta y = 0$. The phase term $\Psi$ is then found from the equation below:

$$\Psi = \tan^{-1} \frac{\sum_i \alpha_i I_i}{\sum_i \beta_i I_i},$$

wherein the values $\alpha_i$ and $\beta_i$ can be determined from phase shift interferometry tables. Generally $\alpha$ and $\beta_i$ depend on a number of phase shifts used and magnitudes of the phase shifts. A convenient and common selection for phase shifts is four measurements (i=1, 2, 3, 4) with phase increments of $\pi/2$, with corresponding measured intensities $I_1$, $I_2$, $I_3$, $I_4$ which leads to the following relation:

$$\Psi = \tan^{-1}\frac{(I_4 - I_2)}{(I_1 - I_3)}.$$

With the phase term determined, the displacement dependent phase term $2k\Delta y \sin(\theta_i)$ can be determined as a difference between phases with and without displacement. With this method, displacements caused by thermal distortion are substantially indistinguishable from displacements associated with reticle stage motion so that interrogation beam detection and signal recording should be carefully timed so that reticle stage motion induced phase contributions do not appear as thermal distortions. The calibration phase shifts $\phi_i$ are normally applied rapidly, to reduce the effects of vibration and air temperature fluctuations. Because of the scanning of the reticle stage, measurements with for each of the calibration phase shift increments will be made at somewhat different reticle locations. Even with phase shifting at rates as high as 1 MHz, at each phase increment, reticle locations are separated by about 1 μm at a reticle stage speed V=1 m/s. Thus, such phase shift calibration measurements can include significant, undesirable $\Delta y$ dependent phase contributions. Therefore, in some examples, phase shift calibration measurements are made during consecutive scans (or other different scans such as alternating scans) at prescribed times at which the reticle stage 1004 and the reticle 1002 are in substantially the same position. During these scans the phase stability of the interferometry apparatus 1000 must be maintained in order to accurately acquire the calibration phase shifts $\phi_i$.

With this technique the component of distortion $\Delta y$ parallel to the plane of incidence of the interrogation beams 1011 and 1014 is determined. By utilizing a second interferometry apparatus with interrogation beams oriented so that their planes of incidence are perpendicular to those of the first interferometry apparatus, a component of the distortion $\Delta x$ can also be measured. Thus by combing the results of the two apparatus, a reticle distortion of arbitrary direction can be determined from its two components $\Delta x$ and $\Delta y$.

Additional Considerations

The methods and apparatus described herein permit assessment of reticle distortions based on the detection and processing of reticle modulated portions of an interrogation flux. Such modulated fluxes can be associated with electrical signals having significant reticle deformation information in signal changes in time periods as short as a few microseconds or less. Depending on a reticle scan speed, signal variations in microsecond time frames may be associated with distortion measurements accurate to about 1 nm at sampling rates of about 1 Gsample/s, with a statistical error in the range of about 1-5%. However at a 1 Gsample/s sampling rate, a 1% statistical error in the detected signal means the signal count rate is $(1/.01)^2 *10^9 =10^{13}$ Hz. For 500 nm photons (~2.5 eV), the associated beam power is $2.5*1.6\times10^{-19}*10^{13}=4$ μW at the detector. Based on a detector collection efficiency of about 0.1%, the power incident on the reticle during a measurement is 4 mW. If the interrogation flux is turned off between measurements, the resulting heat load to the reticle is likely to be negligible. By comparison, the average power absorbed by the reticle during exposure (i.e., during operation of the lithography device) exceeds 4 W. However, the power density from the interrogation beam can be much higher than that during exposure, e.g., if the interrogation beam irradiates a slit pattern on the reticle of area 10 μm×100 μm, the power density is 400 W/cm². This is much higher than during exposure, but it is still significantly below the level of intensity that can cause damage.

In the examples above, reticle stage and reticle motion is generally assumed to be one-dimensional, so that when the stage is at a given location, the reticle is at an associated location exclusive of any induced distortion. However, the reticle stage may not return the reticle to the same location from scan to scan and the reticle may have different positions and orientations relative to one or more interrogation beam detectors, even if the reticle stage returns to the same center-of-mass position. Reticle stage height can also be controlled to vary so as to increase the effective depth of focus (DOF) at the wafer. Since stage DOF corrections are generally measured in most lithographic processing, corresponding corrections can be applied to interrogation beam detector signals. Changes to detector signals tend to be associated with reticle stage z-axis motion, or rotations of the reticle stage in a plane defined by a vertical axis and a propagation direction to an interrogation beam detector. Both of these motions produce vertical displacements of the interrogation beam portions at the detector. In one embodiment, the detector is mounted on an actuator that moves vertically according to a signal from the stage controller to correct for or partially compensate such stage motions. Detector response variations can also be calibrated using fixed patterns mounted on the reticle stage. Complications related to stage positioning can be avoided if distortion measurements are made during a dedicated scan carried out at a prescribed height and orientation. This can be done, for example, during wafer exchange.

Precision Systems

Figure 13:
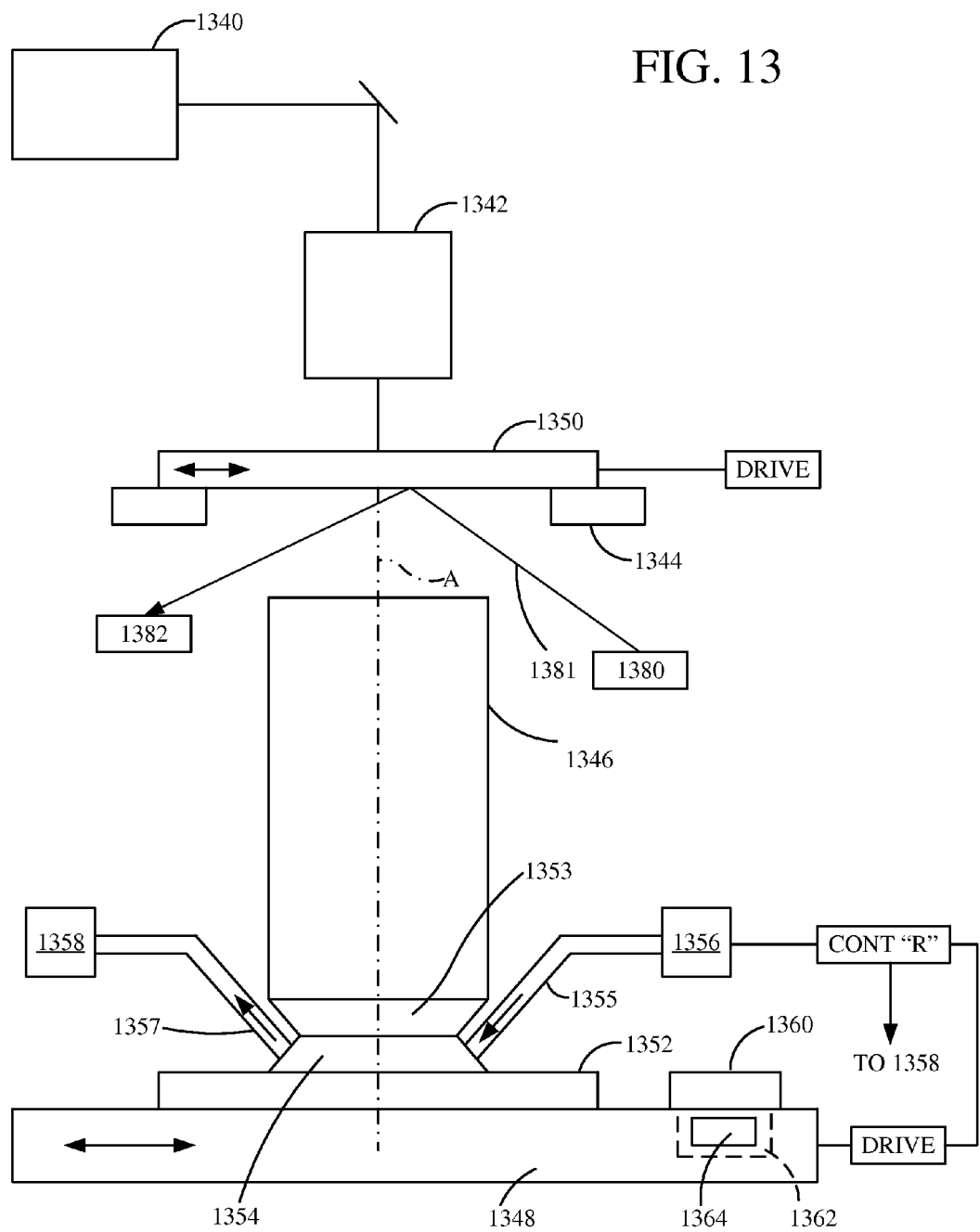
FIG. 13 is a schematic diagram of an immersion microlithography system, which is a first example of a precision system including a stage assembly as described herein.

The methods and apparatus disclosed above can be used in conjunction with various precision systems such as various types of lithography systems and other wafer processing systems and methods. Turning to FIG. 13, certain features of an immersion lithography system (an exemplary precision system) are shown, namely, a light source 1340, an illumination-optical system 1342, a reticle stage 1344, a projection-optical system 1346, and a wafer (substrate) stage 1348, all arranged along an optical axis A. The light source 1340 is configured to produce a pulsed beam of illumination light, such as DUV light of 248 nm as produced by a KrF excimer laser, DUV light of 193 nm as produced by an ArF excimer laser, or DUV light of 157 nm as produced by an $F_2$ excimer laser. The illumination-optical system 1342 includes an optical integrator and at least one lens that conditions and shapes the illumination beam for illumination of a specified region on a patterned reticle 1350 mounted to the reticle stage 1344. The pattern as defined on the reticle 1350 corresponds to the pattern to be transferred lithographically to a wafer 1352 that is held on the wafer stage 1348. Lithographic transfer in this system is by projection of an aerial image of the pattern from the reticle 1350 to the wafer 1352 using the projection-optical system 1346. The projection-optical system 1346 typically comprises many individual optical elements (not detailed) that project the image at a specified demagnification ratio (e.g., 1/4 or 1/5) on the wafer 1352. So as to be imprintable, the wafer surface is coated with a layer of a suitable exposure-sensitive material termed a "resist."

The reticle stage 1344 is configured to move the reticle 1350 in the X-direction, Y-direction, and rotationally about the Z-axis. To such end, the reticle stage is equipped with one or more linear motors having cooled coils as described herein. The two-dimensional position and orientation of the reticle 1350 on the reticle stage 1344 are detected by a laser interferometer (not shown) in real time, and positioning of the reticle 1350 is effected by a main control unit on the basis of the detection thus made.

The wafer 1352 is held by a wafer holder ("chuck," not shown) on the wafer stage 1348. The wafer stage 1348 includes a mechanism (not shown) for controlling and adjusting, as required, the focusing position (along the Z-axis) and the tilting angle of the wafer 1352. The wafer stage 1348 also includes electromagnetic actuators (e.g., linear motors or a planar motor, or both) for moving the wafer in the X-Y plane substantially parallel to the image-formation surface of the projection-optical system 1346. These actuators desirably comprise linear motors, one more planar motors, or both.

The wafer stage 1348 also includes mechanisms for adjusting the tilting angle of the wafer 1352 by an auto-focusing and auto-leveling method. Thus, the wafer stage serves to align the wafer surface with the image surface of the projection-optical system. The two-dimensional position and orientation of the wafer are monitored in real time by another laser interferometer (not shown). Control data based on the results of this monitoring are transmitted from the main control unit to a drive circuits for driving the wafer stage. During exposure, the light passing through the projection-optical system is made to move in a sequential manner from one location to another on the wafer, according to the pattern on the reticle in a step-and-repeat or step-and-scan manner.

The projection-optical system 1346 normally comprises many lens elements that work cooperatively to form the exposure image on the resist-coated surface of the wafer 1352. For convenience, the most distal optical element (i.e., closest to the wafer surface) is an objective lens 1353. Since the depicted system is an immersion lithography system, it includes an immersion liquid 1354 situated between the objective lens 1353 and the surface of the wafer 1352. As discussed above, the immersion liquid 1354 is of a specified type. The immersion liquid is present at least while the pattern image of the reticle is being exposed onto the wafer.

The immersion liquid 1354 is provided from a liquid-supply unit 1356 that may comprise a tank, a pump, and a temperature regulator (not individually shown). The liquid 1354 is gently discharged by a nozzle mechanism 1355 into the gap between the objective lens 1353 and the wafer surface. A liquid-recovery system 1358 includes a recovery nozzle 1357 that removes liquid from the gap as the supply 1356 provides fresh liquid 1354. As a result, a substantially constant volume of continuously replaced immersion liquid 1354 is provided between the objective lens 1353 and the wafer surface. The temperature of the liquid is regulated to be approximately the same as the temperature inside the chamber in which the lithography system itself is disposed.

Also shown is a sensor window 1360 extending across a recess 1362, defined in the wafer stage 1348, in which a sensor 1364 is located. Thus, the window 1360 sequesters the sensor 1364 in the recess 1362. Movement of the wafer stage 1348 so as to place the window 1360 beneath the objective lens 1353, with continuous replacement of the immersion fluid 1354, allows a beam passing through the projection-optical system 1346 to transmit through the immersion fluid and the window 1360 to the sensor 1364.

An interrogation beam source 1380 is situated to direct an interrogation optical beam 1381 to the reticle 1350, and a detection system 1382 is configured to detect a portion of the interrogation beam as modulated by the reticle 1351. The detected beam can be used as described above to assess reticle distortion so that suitable system adjustments can be made to correct, prevent, or at least partially compensate distortion.

Figure 14:
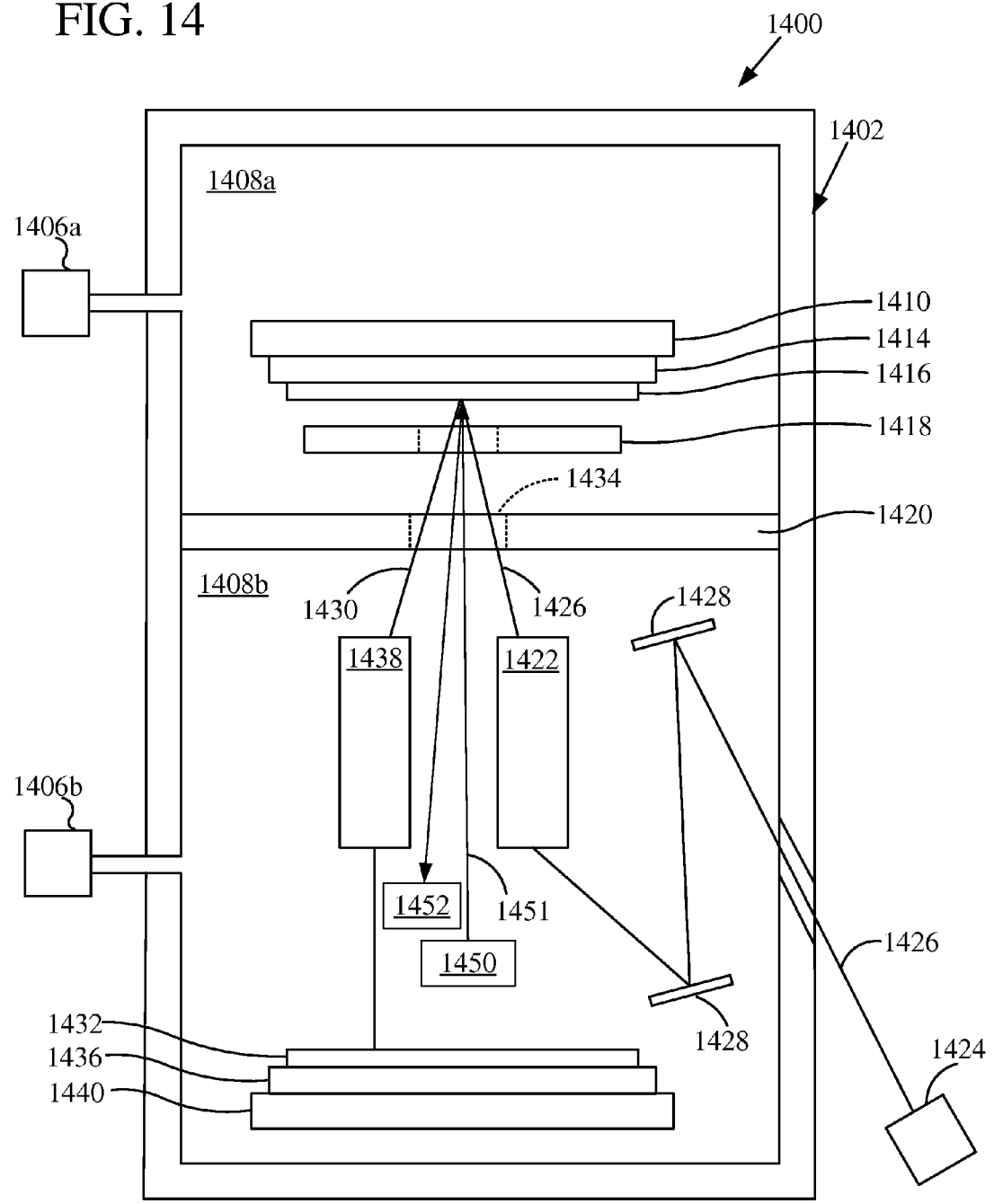
FIG. 14 is a schematic diagram of an extreme-UV microlithography system, which is a second example of a precision system including a stage assembly as described herein.

Referring now to FIG. 14, an alternative embodiment of a precision system that can include one or more electromagnetic actuators having actively cooled coils as described herein is an EUVL system 1400, as a representative precision system incorporating an electromagnetic actuator as described herein, is shown. The depicted system 1400 comprises a vacuum chamber 1402 including vacuum pumps 1406a, 1406b that are arranged to enable desired vacuum levels to be established and maintained within respective chambers 1408a, 1408b of the vacuum chamber 1402. For example, the vacuum pump 1406a maintains a vacuum level of approximately 50 mTorr in the upper chamber (reticle chamber) 1408a, and the vacuum pump 1406b maintains a vacuum level of less than approximately 1 mTorr in the lower chamber (optical chamber) 1408b. The two chambers 1408a, 1408b are separated from each other by a barrier wall 1420. Various components of the EUVL system 1400 are not shown, for ease of discussion, although it will be appreciated that the EUVL system 1400 can include components such as a reaction frame, a vibration-isolation mechanism, various actuators, and various controllers.

An EUV reticle 1416 is held by a reticle chuck 1414 coupled to a reticle stage 1410. The reticle stage 1410 holds the reticle 1416 and allows the reticle to be moved laterally in a scanning manner, for example, during use of the reticle for making lithographic exposures. Between the reticle 1416 and the barrier wall 1420 is a blind apparatus. An illumination source 1424 produces an EUV illumination beam 1426 that enters the optical chamber 1408b and reflects from one or more mirrors 1428 and through an illumination-optical system 1422 to illuminate a desired location on the reticle 1416. As the illumination beam 1426 reflects from the reticle 1416, the beam is "patterned" by the pattern portion actually being illuminated on the reticle. The barrier wall 1420 serves as a differential-pressure barrier and can serve as a reticle shield that protects the reticle 1416 from particulate contamination during use. The barrier wall 1420 defines an aperture 1434 through which the illumination beam 1426 may illuminate the desired region of the reticle 1416. The incident illumination beam 1426 on the reticle 1416 becomes patterned by interaction with pattern-defining elements on the reticle, and the resulting patterned beam 1430 propagates generally downward through a projection-optical system 1438 onto the surface of a wafer 1432 held by a wafer chuck 1436 on a wafer stage 1440 that performs scanning motions of the wafer during exposure. Hence, images of the reticle pattern are projected onto the wafer 1432.

The wafer stage 1440 can include (not detailed) a positioning stage that may be driven by a planar motor or one or more linear motors, for example, and a wafer table that is magnetically coupled to the positioning stage using an EI-core actuator, for example. The wafer chuck 1436 is coupled to the wafer table, and may be levitated relative to the wafer table by one or more voice-coil motors, for example. If the positioning stage is driven by a planar motor, the planar motor typically utilizes respective electromagnetic forces generated by magnets and corresponding armature coils arranged in two dimensions. The positioning stage is configured to move in multiple degrees of freedom of motion, e.g., three to six degrees of freedom, to allow the wafer 1432 to be positioned at a desired position and orientation relative to the projection-optical system 1438 and the reticle 1416.

An EUVL system including the above-described EUV-source and illumination-optical system can be constructed by assembling various assemblies and subsystems in a manner ensuring that prescribed standards of mechanical accuracy, electrical accuracy, and optical accuracy are met and maintained. To establish these standards before, during, and after assembly, various subsystems (especially the illumination-optical system 1422 and projection-optical system 1438) are assessed and adjusted as required to achieve the specified accuracy standards. Similar assessments and adjustments are performed as required of the mechanical and electrical subsystems and assemblies. Assembly of the various subsystems and assemblies includes the creation of optical and mechanical interfaces, electrical interconnections, and plumbing interconnections as required between assemblies and subsystems. After assembling the EUVL system, further assessments, calibrations, and adjustments are made as required to ensure attainment of specified system accuracy and precision of operation. To maintain certain standards of cleanliness and avoidance of contamination, the EUVL system (as well as certain subsystems and assemblies of the system) are assembled in a clean room or the like in which particulate contamination, temperature, and humidity are controlled.

As shown in FIG. 14, an interrogation beam source 1450 can be situated so as to direct an interrogation optical beam 1451 to the reticle 1416. A detection system 1452 is situated to receive at least a portion of the interrogation beam that is reflected, refracted, diffracted, phase-shifted or otherwise modulated by interaction with the reticle 1416. Based on a detector signal response to this beam portion, reticle distortion can be assessed as described above in the detection system.

Figure 15:
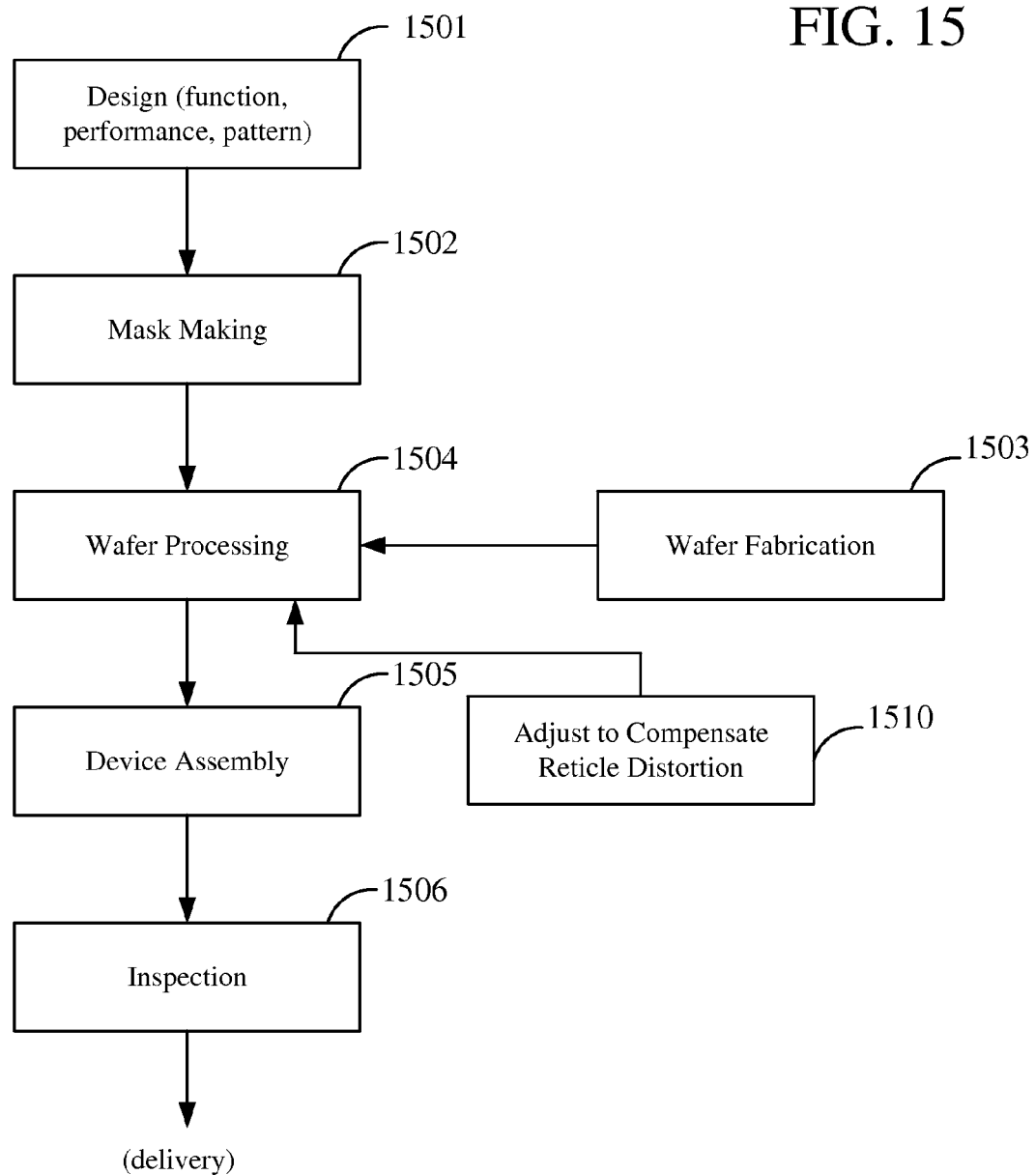
FIG. 15 is a process-flow diagram depicting exemplary steps associated with a process for fabricating semiconductor devices.

Semiconductor devices can be fabricated by processes including microlithography steps performed using a microlithography system as described above. Referring to FIG. 15, in step 1501 the function and performance characteristics of the semiconductor device are designed. In step 1502 a reticle ("mask") defining the desired pattern is designed and fabricated according to the previous design step. Meanwhile, in step 1503, a substrate (wafer) is fabricated and coated with a suitable resist. In step 1504 ("wafer processing") the reticle pattern designed in step 1502 is exposed onto the surface of the substrate using the microlithography system. In a step 1510, reticle distortion can be estimated during exposure as described above. In step 1505 the semiconductor device is assembled (including "dicing" by which individual devices or "chips" are cut from the wafer, "bonding" by which wires are bonded to particular locations on the chips, and "packaging" by which the devices are enclosed in appropriate packages for use). In step 1506 the assembled devices are tested and inspected.

Figure 16:
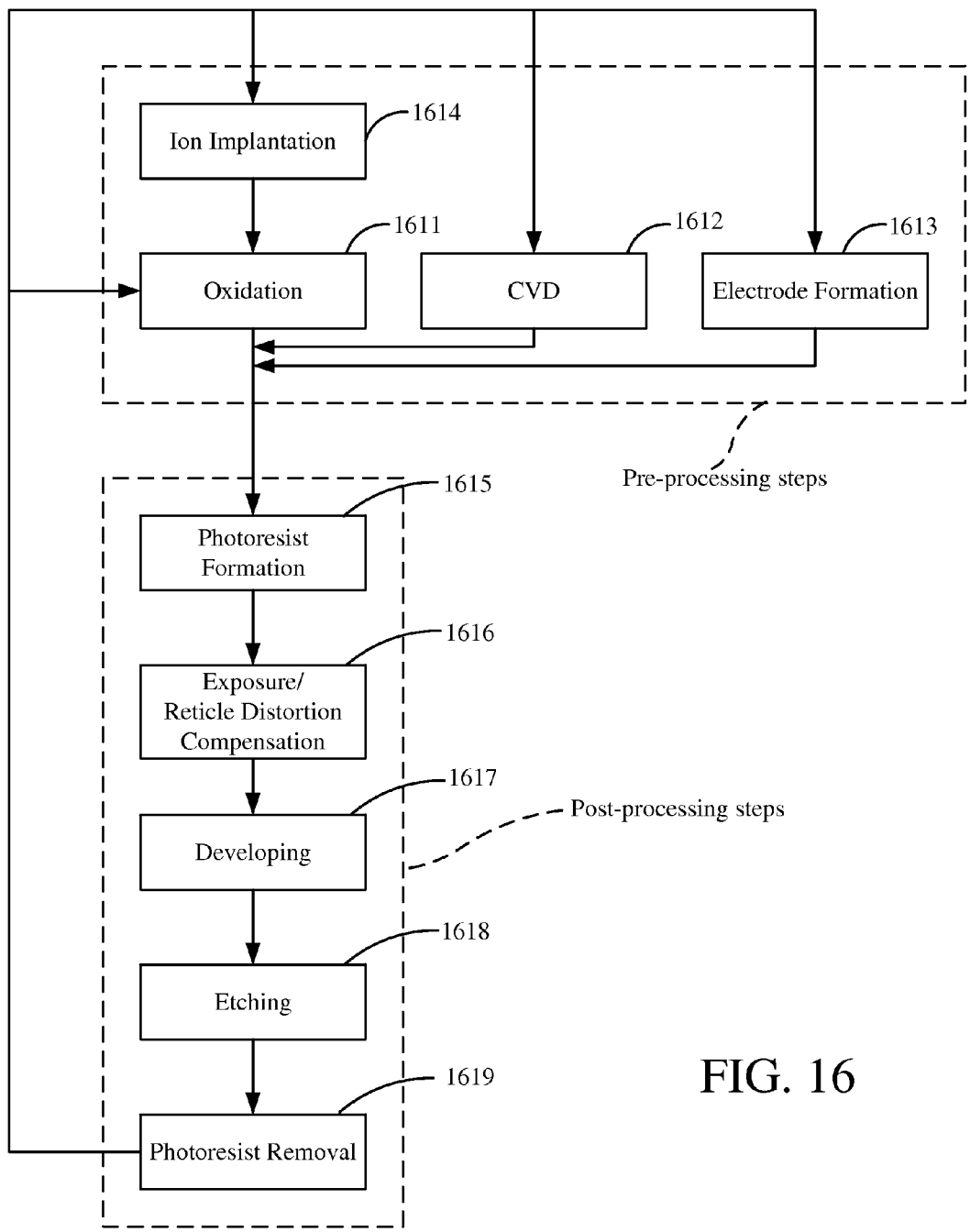
FIG. 16 is a process-flow diagram depicting exemplary steps associated with a processing a substrate (e.g., a wafer), as would be performed, for example, in the process shown in FIG. 15.

Representative details of a wafer-processing process including a microlithography step are shown in FIG. 16. In step 1611 ("oxidation") the wafer surface is oxidized. In step 1612 ("CVD") an insulative layer is formed on the wafer surface by chemical-vapor deposition. In step 1613 (electrode formation) electrodes are formed on the wafer surface by vapor deposition, for example. In step 1614 ("ion implantation") ions are implanted in the wafer surface. These steps 1611-1614 constitute representative "pre-processing" steps for wafers, and selections are made at each step according to processing requirements.

At each stage of wafer processing, when the pre-processing steps have been completed, the following "post-processing" steps are implemented. A first post-process step is step 1615 ("photoresist formation") in which a suitable resist is applied to the surface of the wafer. Next, in step 1616 ("exposure"), the microlithography system described above is used for lithographically transferring a pattern from the reticle to the resist layer on the wafer. Reticle distortion can be compensated during pattern transfer. In step 1617 ("developing") the exposed resist on the wafer is developed to form a usable mask pattern, corresponding to the resist pattern, in the resist on the wafer. In step 1618 ("etching"), regions not covered by developed resist (i.e., exposed material surfaces) are etched away to a controlled depth. In step 1619 ("photoresist removal"), residual developed resist is removed ("stripped") from the wafer.

Formation of multiple interconnected layers of circuit patterns on the wafer is achieved by repeating the pre-processing and post-processing steps as required. Generally, a set of pre-processing and post-processing steps are conducted to form each layer.

The disclosed methods and apparatus can be applied to the estimation and detection of reticle distortions in lithographic systems such as described above. An optical interrogation beam can be directed to a reticle, and portions of such a beam that are reflected, refracted, diffracted, scattered or otherwise captured by a detector can be used to produce electrical signals indicative of reticle deformation. Typically electrical signals obtained from two or more scans are used, and the interrogation beam can be patterned a magnitude and a direction or the distortion can be estimated.

The above examples are provided in order to illustrate selected embodiments, but the invention is not to be limited by features in any particular embodiment. I claim all that is encompassed by the appended claims.

The invention claimed is:

1. A method for detecting reticle pattern distortion, the method comprising:
   (a) directing at least one optical beam to be incident on the reticle as the reticle undergoes a first scanning motion;
   (b) detecting at least one segment of a secondary light signal associated with an interaction of the at least one optical beam with the reticle during the first scanning motion;
   (c) directing at least one optical beam to be incident on the reticle as the reticle undergoes a second scanning motion, the second scanning motion performed at a time different than a time associated with the first scanning motion;
   (d) detecting at least one segment of a secondary light signal associated with an interaction of the at least one optical beam and the reticle during the second scanning motion; and
   (e) based on the detected segments associated with the first scanning motion of the reticle and the second scanning motion of the reticle, determining that the reticle pattern is distorted.

2. The method of claim 1, wherein the determination is based on a comparison of at least one segment among the segments detected during the first scanning motion of the reticle and the second scanning motion of the reticle, with a reference segment.

3. The method of claim 2, further comprising directing an exposure beam to the reticle during acquisition of the detected segment.

4. The method of claim 2, wherein the at least one segment is detected interferometrically.

5. The method of claim 4, further comprising providing a reference optical beam, wherein the at least one segment is detected interferometrically based on interference with the reference optical beam.

6. The method of claim 3, wherein the at least one segment is detected based on at least one detected speckle pattern.

7. The method of claim 3, further comprising estimating at least one of a magnitude and a phase of a distortion.

8. The method of claim 7, wherein the estimate is based on a temporal shift between the detected segment and the reference segment.

9. The method of claim 1, further comprising:
repetitively detecting segments of secondary light signals associated with an interaction of the at least one optical beam and the reticle during at least portions of a series of scan intervals, wherein determining the reticle pattern is distorted based on comparisons of the detected segments.

10. The method of claim 9, further comprising estimating at least one of distortion magnitude and direction based on the comparison.

11. The method of claim 9, wherein the comparisons are based on correlation of detected segments.

12. The method of claim 9, wherein the segments are detected based on optical interference or speckle.

13. An apparatus, comprising:
an optical radiation source configured to produce a patterned interrogation beam and direct the patterned beam to a reticle plane;
a detection system situated to receive at least a portion of the patterned interrogation beam from the reticle plane and produce a detected optical signal; and
a processing system coupled to the detection system, the processing system providing an indication of pattern distortion at the reticle plane based on a variation in the detected optical signal as a function of time.

14. The method of claim 13, wherein the patterned interrogation beam is asymmetric with respect to a reticle scan direction.

15. The apparatus of claim 13, wherein the processing system is configured to estimate a distortion direction based on the asymmetry of the patterned interrogation beam.

16. The apparatus of claim 13, wherein the patterned interrogation is elongated along a scan direction or in a direction orthogonal to the scan direction.

17. The apparatus of claim 13, wherein the patterned interrogation beam has a slit pattern that is elongated parallel to or at an angle of 45 degrees with respect to the scan direction.

18. The apparatus of claim 13, wherein the detector is configured to detect the portion of the patterned interrogation beam by direct detection or phase-sensitive detection.

19. The apparatus of claim 13, wherein the detector is configured to detect the portion of the patterned interrogation beam as a speckle pattern, and the processor is configured to estimate pattern distortion magnitude and direction based on the speckle pattern.

20. A lithographic system for transferring a pattern from a reticle to a sensitized substrate, comprising the apparatus of claim 13.

21. A lithographic method, comprising:
detecting a reticle pattern distortion according to the method of claim 1; and
adjusting at least one lithographic system parameter based on the detected reticle pattern distortion.

22. A lithographic method, comprising:
detecting a reticle pattern distortion according to the method of claim 9; and
adjusting at least one lithographic system parameter based on the detected reticle pattern distortion.

* * * * *